United States Patent [19]
Okazaki et al.

[11] Patent Number: 4,771,439
[45] Date of Patent: Sep. 13, 1988

[54] DIFFERENTIAL CODING CIRCUIT WITH REDUCED CRITICAL PATH APPLICABLE TO DPCM

[75] Inventors: Takeshi Okazaki, Kawasaki; Toshitaka Tsuda; Shin-ichi Maki, both of Yokohama; Kiichi Matsuda; Hirohisa Gambe, both of Kawasaki; Hirokazu Fukui; Toshi Ikezawa, both of Yokohama, all of Japan

[73] Assignee: Fujitsu Limited, Kawasaki, Japan

[21] Appl. No.: 49,048

[22] Filed: May 12, 1987

Related U.S. Application Data

[63] Continuation of Ser. No. 770,206, Aug. 28, 1985, abandoned.

[30] Foreign Application Priority Data

| Aug. 30, 1984 | [JP] | Japan | 59-181061 |
| Nov. 19, 1984 | [JP] | Japan | 59-243813 |
| Nov. 19, 1984 | [JP] | Japan | 59-242456 |
| Nov. 20, 1984 | [JP] | Japan | 59-245775 |
| May 18, 1985 | [JP] | Japan | 60-104948 |
| May 18, 1985 | [JP] | Japan | 60-104951 |
| Dec. 14, 1985 | [JP] | Japan | 60-263972 |

[51] Int. Cl.$^4$ .......................................... H04B 14/06
[52] U.S. Cl. ........................................ 375/27; 358/135; 332/11 D
[58] Field of Search ............... 375/27, 30, 122; 358/133, 135; 381/29, 31; 332/11 D

[56] References Cited

U.S. PATENT DOCUMENTS

| 4,179,710 | 12/1979 | Ishiguro et al. | 375/122 |
| 4,317,208 | 2/1982 | Araseki et al. | 375/27 |
| 4,470,146 | 9/1984 | Yatsuzuka et al. | 358/135 |

*Primary Examiner*—Robert L. Griffin
*Assistant Examiner*—Stephen Chin
*Attorney, Agent, or Firm*—Staas & Halsey

[57] ABSTRACT

A differential coding circuit including a subtracter, a quantizer for quantizing a differential signal from the subtracter, and a predicted signal generating circuit for generating a predicted signal on the basis of a quantized differential signal from the quantizer. The subtracter subtracts the quantized differential signal of the quantizer and the predicted signal from the sampled input signal. The critical path of the circuit is shortened, therefore the operation speed of the differential coding circuit increases.

24 Claims, 19 Drawing Sheets

DIFFERENTIAL CODING CIRCUIT WITH REDUCED CRITICAL PATH APPLICABLE TO DPCM

This is a continuation of co-pending application Ser. No. 770,206 filed on Aug. 28, 1985, now abandoned.

BACKGROUND OF THE INVENTION

1. Field of the Invention

The present invention relates to a differential coding circuit such as a differential pulse code modulation (DPCM) coder which operates at a high speed.

The differential coding circuit according to the present invention can be used, for example, as a device which effects bandwidth compression coding of a picture signal.

2. Description of the Related Art

A differential coding circuit of the prior art, as described later in more detail, includes, for example, a subtractor for calculating a differential signal between a sampled input signal and a predicted signal, a quantizer for quantizing the differential signal, an adder for adding a quantized differential signal from the quantizer and a predicted signal before one sampling period, and a multiplier for multiplying an output signal of the adder by a prediction coefficient so as to generate the predicted signal. When used as a picture bandwidth compression coding device, however, the speed of operation is not as high as desired.

SUMMARY OF THE INVENTION

It is an object of the present invention to provide an improved differential coding circuit which has an increased speed of operation for carrying out, for example, bandwidth compression using a DPCM coder.

According to the fundamental aspect of the present invention, there is provided a differential coding circuit including the combination of means for effecting subtraction on an input signal to be quantized to produce a differential signal; means for quantizing the differential signal of the subtracting means; means for generating a predicted signal on the basis of the quantized differential signal output from the quantizing means; and product means for supplying a quantized product corresponding to the quantized differential signal multiplied by a prediction coefficient. The subtracting means subtracts the quantized product and the predicted signal output by the predicted signal generating means from the input signal to be quantized. This structure reduces the critical path which usually passes through the product means.

BRIEF DESCRIPTION OF THE DRAWINGS

Embodiments of a differential coding circuit in accordance with the present invention will now be described with reference to the accompanying drawings, in which.

DESCRIPTION OF THE PREFERRED EMBODIMENTS

For a better understanding of the preferred embodiments, the differential coding circuit of the present invention will first be explained in comparison with the differential coding circuit of the prior art.

Figure 1:
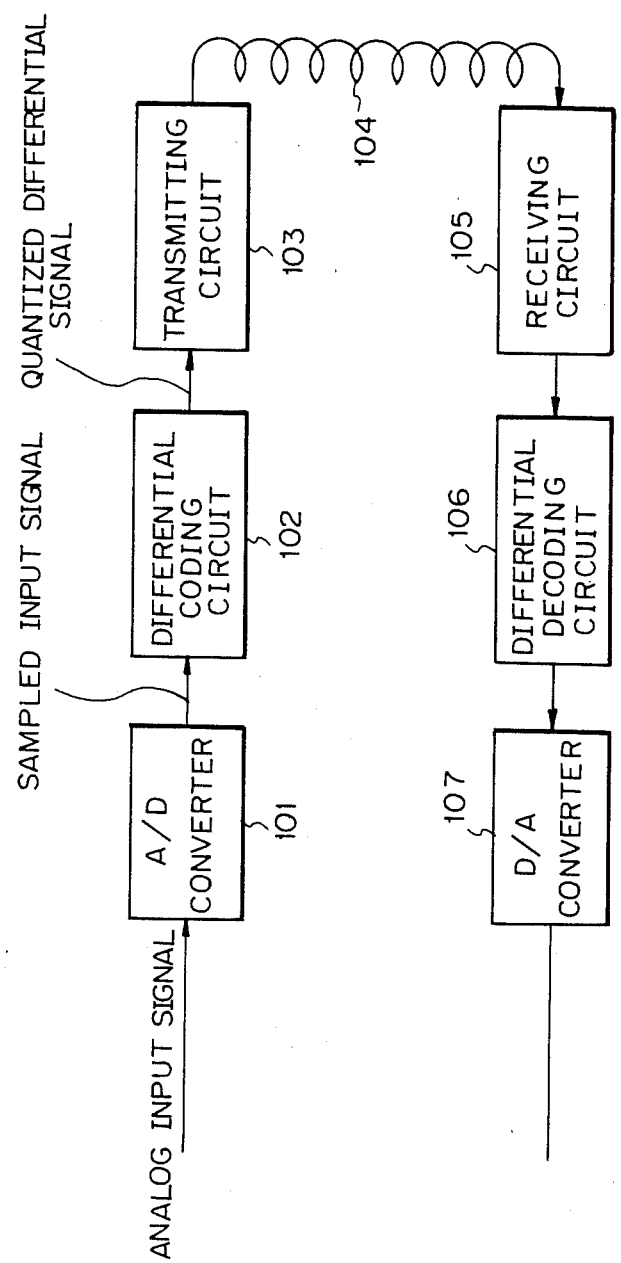
FIG. 1 is a block diagram of a communication system in which a differential coding circuit is used.
Figure 2:
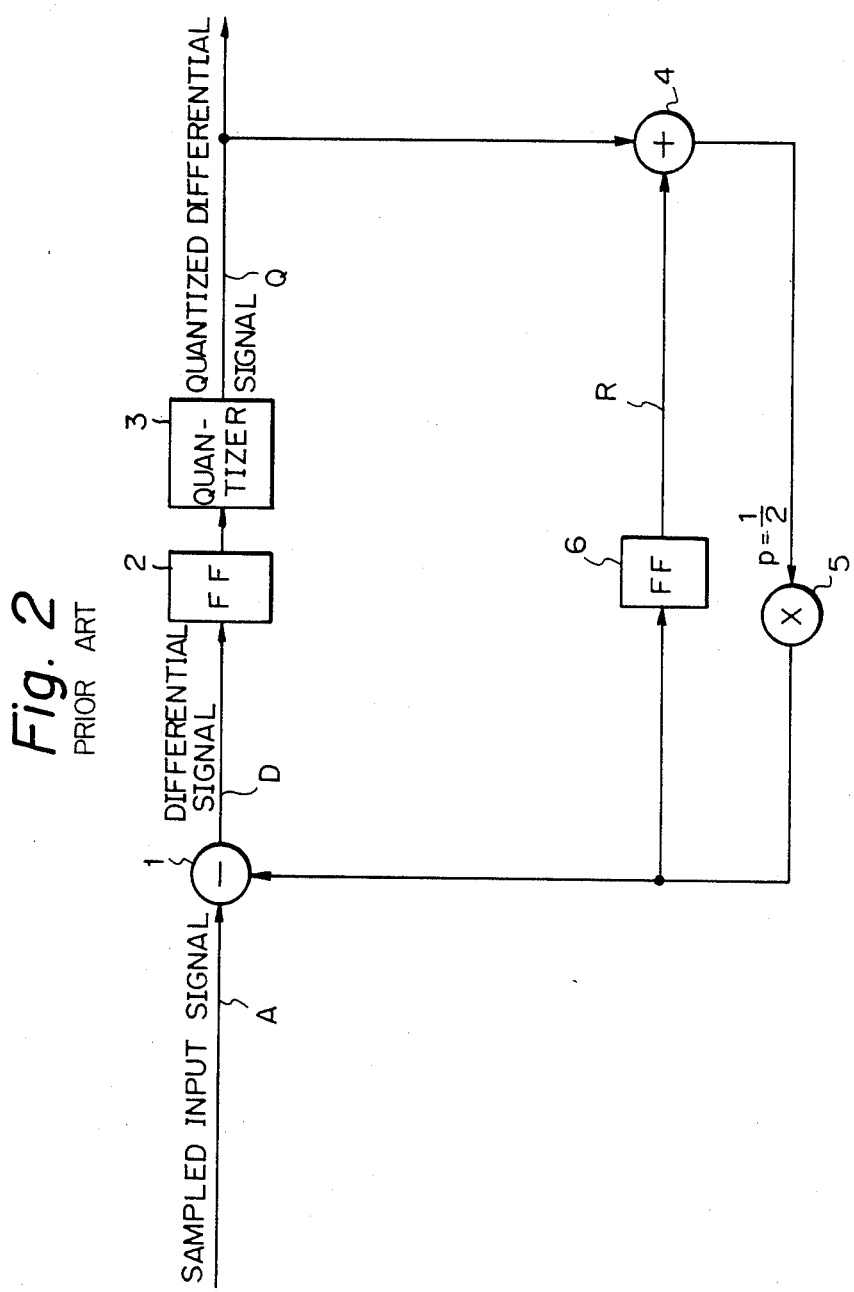
FIG. 2 is a block diagram of a differential coding circuit of the prior art.

FIG. 1 shows one example of a communication system in which a DPCM system is used. FIG. 2 is a block diagram of a differential coding circuit of the prior art used in the system of FIG. 1. In FIG. 1, block 101 is an analog-to-digital (A/D) converter which samples an analog input signal in a constant period and converts it to a digital sampled signal. Block 102 is a differential coding circuit to which the sampled input signal is input from the A/D converter 101 and which outputs a quantized differential signal obtained by quantizing a differential signal between the sampled input signal and a predicted signal generated in the differential coding circuit 102. Block 103 is a transmitting circuit for coding the quantized differential signal (or DPCM signal) into a form for transmission and sending that signal to the transmission line. Block 104 is a transmission line, block 105 is a receiving circuit, block 106 is a differential decoding circuit, and block 107 is a digital-to-analog (D/A) converter.

In FIG. 2, 1 is a subtracter, 2 a flip-flop as a delay element, 3 a quantizer, 4 an adder, 5 a multiplier for multiplying an input signal by a prediction coefficient p (for example, ½), and 6 a flip-flop as a delay element.

The mode of operation of the differential coding circuit illustrated in FIG. 2 will be explained below. A sampled input signal from the A/D converter 101 is input into the subtracter 1, which calculates a differential signal between the sampled input signal and a predicted signal from the multiplier 5. This differential signal is input into the quantizer 3 via the flip-flop 2, which delays the differential signal by one sampling period. The quantizer 3 quantizes the differential signal and outputs the quantized differential signal (or DPCM signal) to the transmitting circuit 103. This quantized differential signal is also input into the adder 4. The adder 4 adds this quantized differential signal and a prior predicted signal stored in the flip-flop 6. The multiplier 5 multiplies the above summed value by the prediction coefficient p to generate the current predicted signal and sends this current predicted signal into the subtracter 1. The subtracter 1 subtracts the current predicted signal from the sampled input signal, as described above. Thus, the differential coding circuit of FIG. 2 outputs a quantized differential signal to the transmitting circuit 103.

Figure 3:
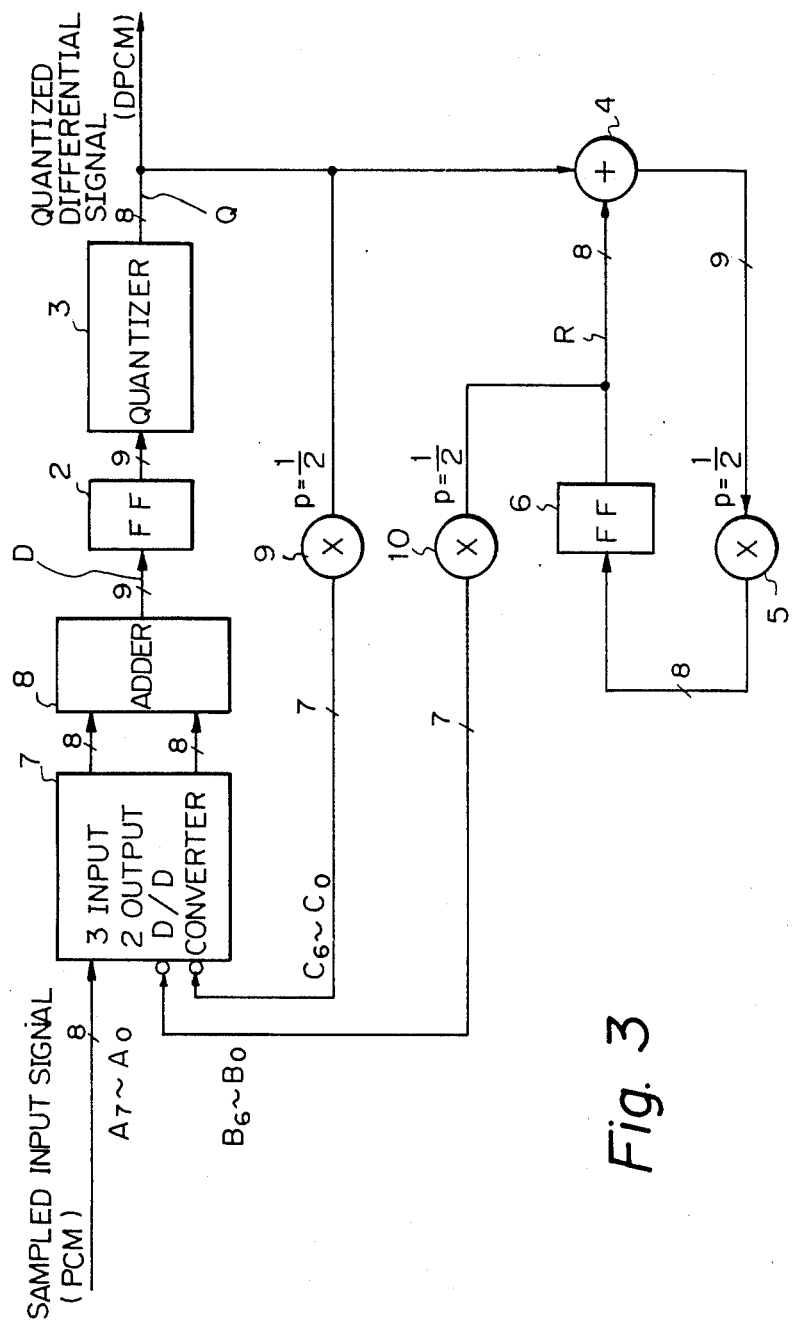
FIG. 3 is a block diagram of a differential coding circuit according to one embodiment of the present invention.

FIG. 3 shows an embodiment of a differential coding circuit according to the present invention. Elements having the same function as in previous drawings bear the same reference numerals in FIG. 3 and subsequent figures. The circuit of FIG. 3 is disposed at the position of the differential circuit 102 in FIG. 1.

In FIG. 3, the signal lines are represented by a single line. In practice, of course, there are a plurality of signal lines in a parallel array. The number of lines is indicated by the numerals above the slash marks on the signal lines.

The sampled input signal from the A/D converter 102 is input to the carry input terminal of a digital-to-digital (D/D) converter 7 having three input terminals and two output terminals. The D/D converter 7 outputs a carry signal and a summed signal to the adder 8. The D/D converter 7 and the adder 8 function equivalently to the subtracter 1 in FIG. 2, in other words, the adder 8 outputs a differential signal. This differential signal is input to the quantizer 3 via the flip-flop 2, which works as a delay element, and is then quantized by the quantizer 3. The quantized differential signal from the quantizer 3 is sent to the adder 5 and the multiplier 9. The quantized differential signal input into the multiplier 9 is multiplied by the prediction coefficient p ($p=\frac{1}{2}$, in this example) at the multiplier 9 to produce a quantized product which is inverted and input into the addition input terminal of the D/D converter 7. On the other hand, the quantized differential signal input into the adder 4 is added to the content of the flip-flop 6 at the adder 4. The summed signal is multiplied by the prediction coefficient p at the multiplier 5, then is input into the flip-flop 6. The output signal of the flip-flop 6, i.e., a prior predicted signal from before one sampling period earlier, is multiplied by the prediction coefficient p at the multiplier 10, then inverted and input into the other addition input terminal of the D/D converter 7.

The D/D converter 7 calculates the differential value between the sampled input signal and the output signals from the multipliers 9 and 10 for each line and converts these three input signals into two output signals. These two output signals are added by the adder 8. The output signal of the adder 8 is input into the quantizer 3 via the flip-flop 2.

Figure 4:
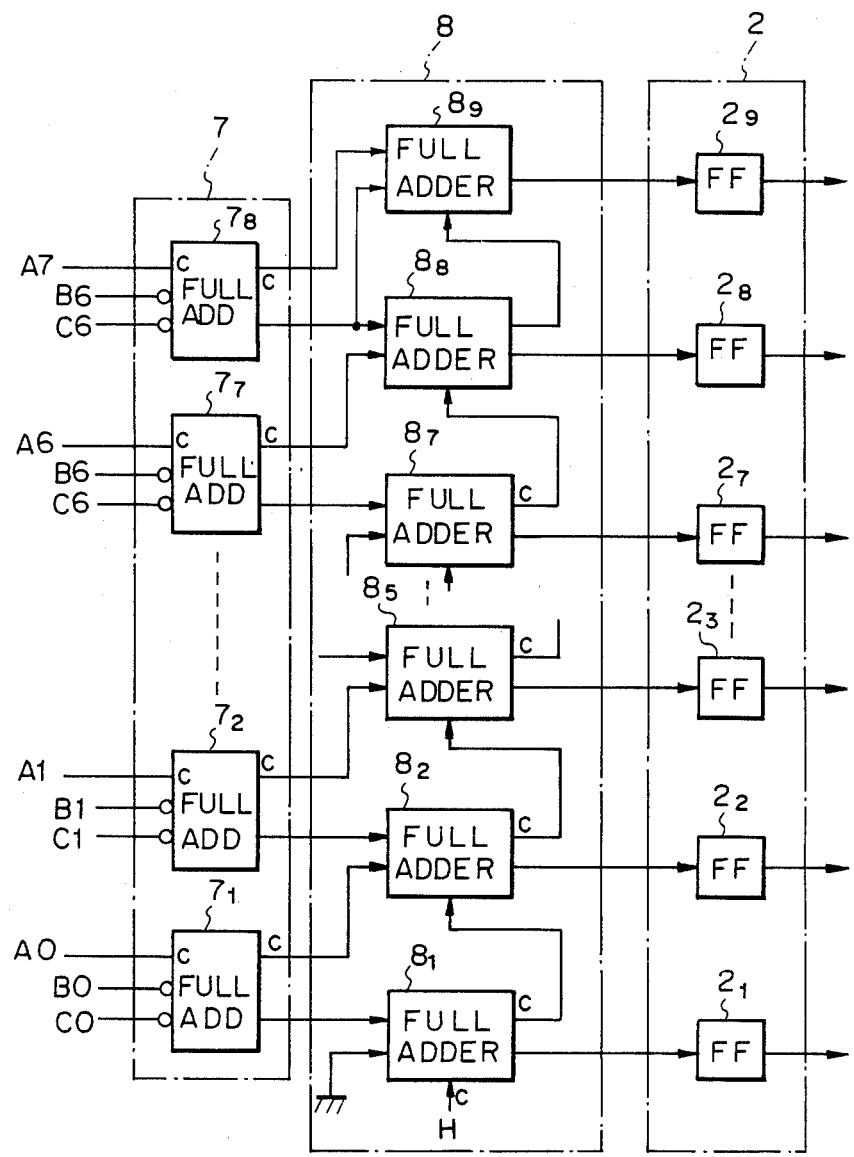
FIG. 4 is a more detailed block diagram of a D—D converter, an adder, and a flip-flop in FIG. 3.

FIG. 4 is a more detailed block diagram of the D/D converter 7, the adder 8, and flip-flop 2 of FIG. 3. In FIG. 4, the D/D converter 7 includes eight full-adders $7_1$ to $7_8$. The adder 8, includes nine full-adders $8_1$ to $8_9$, and the flip-flop 2 includes nine one-bit type flip-flops $2_1$ to $2_9$. A7 to A0 represent eight bits of a sampled input signal. B6 to B0 and C6 to C0 represent seven bits of signals obtained by multiplying eight bits of the output signal of the quantizer 3 by the prediction coefficient p (i.e., $\frac{1}{2}$) at the multipliers 9 and 10, respectively.

The bits A0 to A7 of the sampled input signal are input into the carry input terminal of the full-adders $7_1$ to $7_8$, respectively. The bits B0 to B6 and bits C0 to C6 are inverted and input into two addition input terminals of the full-adders $7_1$ to $7_7$, respectively. In the case of the full-adder $7_8$ of the most significant bit (MSB), the bits B6 and C6 are input to the addition terminals. The summed output terminals of the full-adders $7_1$ to $7_8$ are connected to the addition input terminals of the full-adders $8_1$ to $8_8$ of the adder 8, respectively. The summed output terminal of the full-adder $7_8$ is also connected to the addition input terminal of the full-adder $8_9$. The carry output terminals of the full-adders $7_1$ to $7_8$ are connected to the other addition input terminals of the full-adders $8_2$ to $8_9$, respectively. The other addition input terminal of the full-adder $8_1$ of the least significant bit (LSB) is grounded. Alternatively, a correction signal of the operation precision may be supplied to the other addition input terminal of full-adder 8. The carry output terminals of the full-adders $8_1$ to $8_8$ are connected to the carry input terminals of the next significant full-adders $8_2$ to $8_9$, respectively, except that the high level voltage is applied to the carry input terminal of the full-adder $8_1$.

The summed output terminals of the full-adders $8_1$ to $8_9$ are connected to the quantizer 3 via the flip-flops $2_1$ to $2_9$, respectively.

The differential coding circuits of FIG. 2 and FIG. 3 operate equivalently in function. That is, in FIG. 2, if A represents the sampled input signal, D the differential signal input into the flip-flop 2, Q the quantized differential signal output from the quantizer 3, R the output signal of the flip-flop 6 to the adder 4, and p the prediction coefficient, the predicted signal to the subtracter 1 is expressed by $p \times (Q+R)$. Therefore, the differential signal D is expressed as;

$$D = A - p \times (Q + R)$$

On the other hand, in FIG. 3, the differential signal D is expressed as;

$$D = A - p \times Q - p \times R$$

As obvious from these two expressions, the circuits of FIG. 2 and FIG. 3 are equivalent in function.

The operation speed of the differential coding circuits of FIG. 2 and FIG. 3 is dependent upon the critical path of the signal, i.e., the path with the longest signal transmission time. The critical path of FIG. 2 is, based on the flip-flop 2, the path from the flip-flop 2 through the quantizer 3, adder 4, multiplier 5, and subtracter 1 and back to the flip-flop 2. In the case of FIG. 3, three signal paths should be investigated; a first path from the flip-flop 2 via the quantizer 3, the multiplier 9, the D/D converter 7, and the adder 8 and back to the flip-flop 2; a second path from the flip-flop 2 via the quantizer 3, the adder 4, and the multiplier 5 to the flip-flop 6; and a third path from the flip-flop 6 through the multiplier 10, the D/D converter 7, and the adder 8 to the flip-flop 2.

Regarding the operation speeds of each element of the circuit, the subtracter 1 and the adders 4 and 8 take more operation time than the D/D converter 7, since they consist of serial arithmetic circuits which involve a carry from the LSB to MSB in sequence. Accordingly, of the three paths of FIG. 3, the first path is the critical path requiring the longest signal transmission time.

Comparing the critical path of the circuit of FIG. 3 with that of FIG. 2, the adder 8 and the adder 4 have almost the same operation speed, and the D/D converter 7 is faster that the subtracter 1. As a result, the FIG. 3 circuit is faster than the FIG. 2 circuit by the difference in speed of the converter over the subtracter.

FIGS. 5 through 9 show other embodiments of the differential coding circuit according to the present invention. These embodiments are modified in regard to the consitution of the adder 4, the multiplier 5, the flip-flop 6, and the multiplier 10 of FIG. 3. However, these circuits are equivalent to the circuit of FIG. 3 in function.

Figure 5:
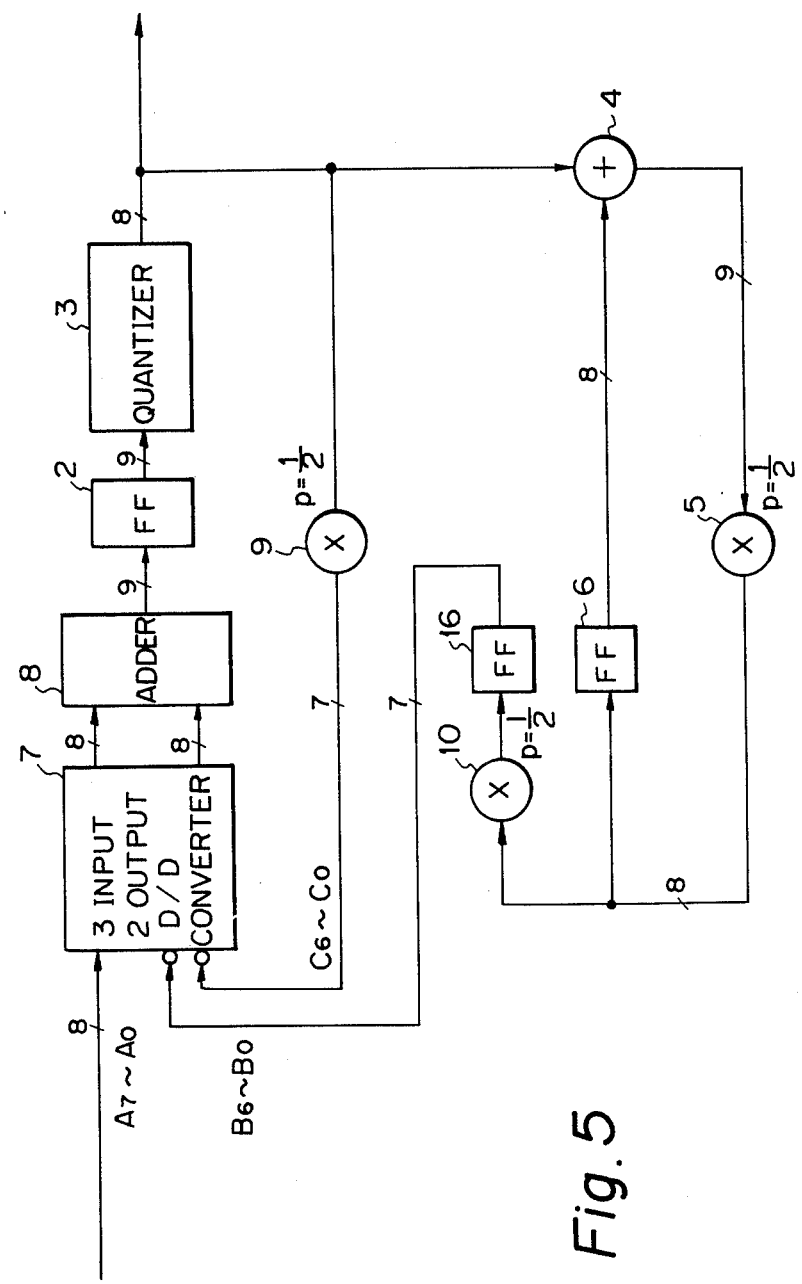
FIGS. 5 through 16 are block diagrams of differential coding circuits according to other embodiments of the present invention.

In FIG. 5, the first predicted signal from the multiplier 5 is inverted and input into the input terminal of the D/D converter 7 via the multiplier 10 and the flip-flop 16 as a second predicted signal.

Figure 6:
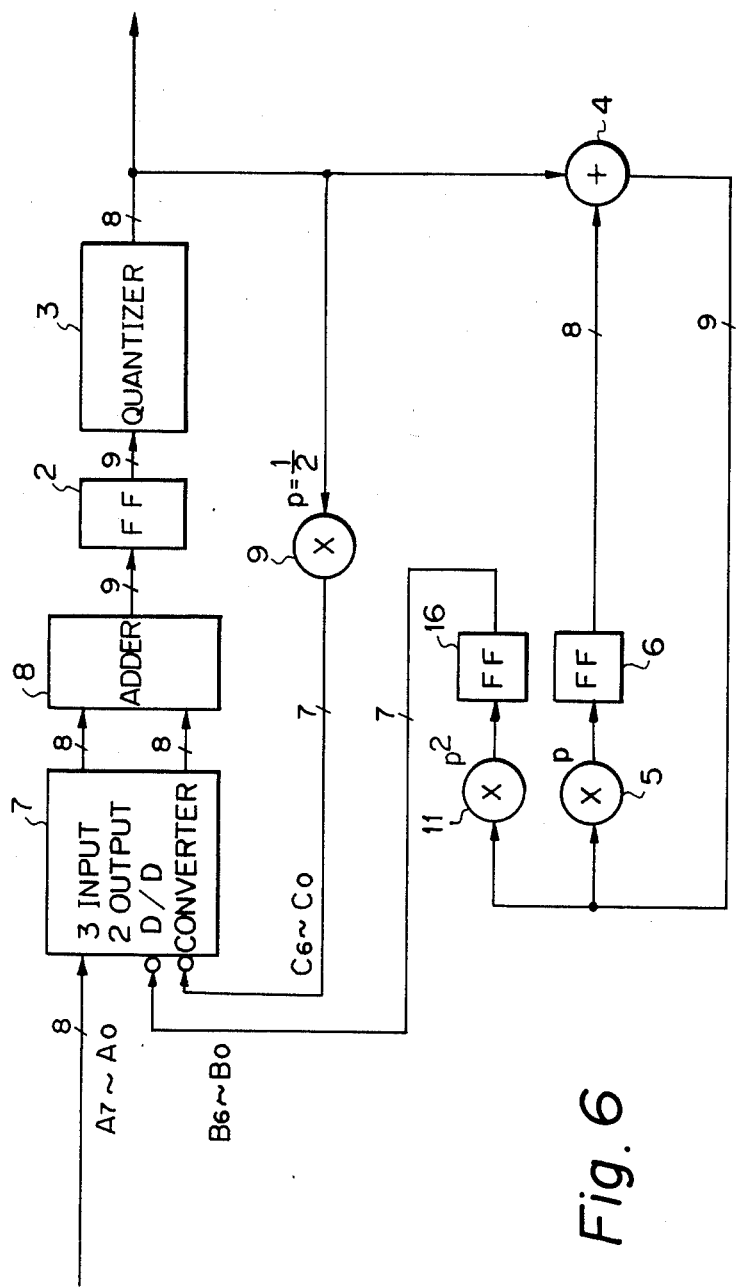

In FIG. 6, the output signal of the adder 4 is inverted and input to the input terminal of the D/D converter 7 via a multiplier 11 which multiplies its input signal by a square of the prediction coefficient p and the flip-flop 16.

Figure 7:
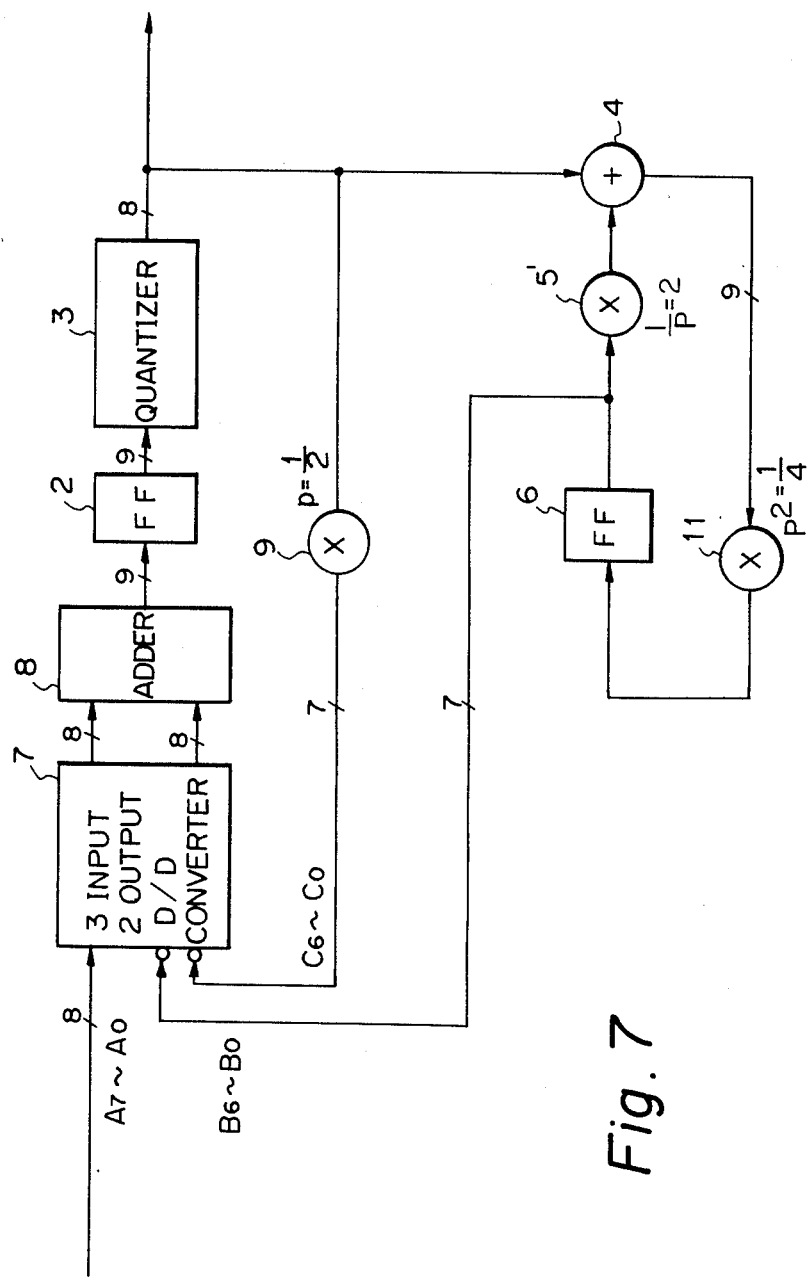

In FIG. 7, the positions of the multiplier 5 and the flip-flop 6 are reversed, in comparison with FIG. 3; therefore, the multiplier, indicated by 5', multiplies by 1/p or divides by p and the output signal of the adder 4 is input to the flip-flop 6 via the multiplier 11 described above. Further, the output signal of the flip-flop 6 is inverted and input to the input terminal of the D/D converter 7.

Figure 8:
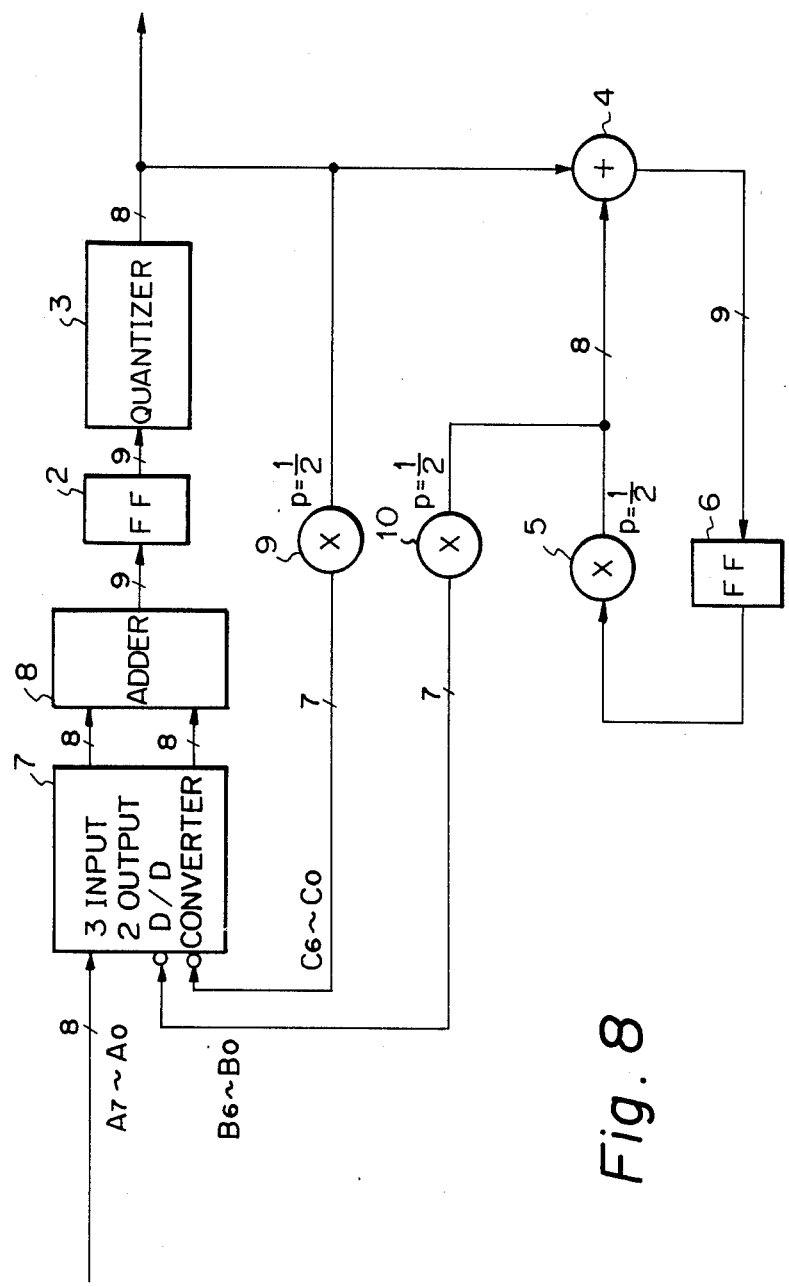

In FIG. 8, the positions of the multiplier 5 and the flip-flop 6 are also reversed in comparison with FIG. 3, and the output signal of the multiplier 5 is inverted and input to the input terminal of the D/D converter 7 via the multiplier 10.

Figure 9:
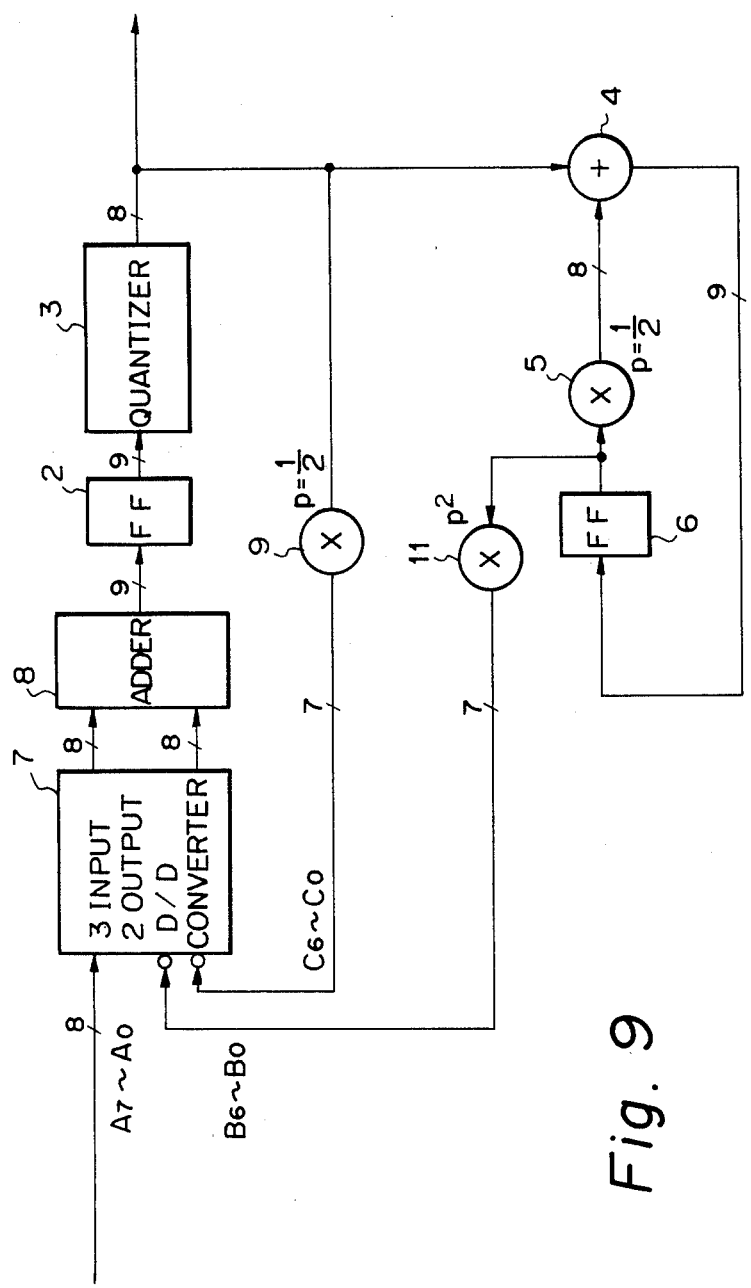

In FIG. 9, the positions of the multiplier 5 and the flip-flop 6 are also reversed in comparison with FIG. 3, and the output signal of the flip-flop 6 is inverted and input to the input terminal of the D/D converter 7 via the multiplier 11 described above.

Furthermore, as in other embodiments of the present invention, it is possible to reverse the positions of the flip-flop 2 and the quantizer 3 in the circuits illustrated in FIGS. 3 and 5 through 9.

Figure 10:
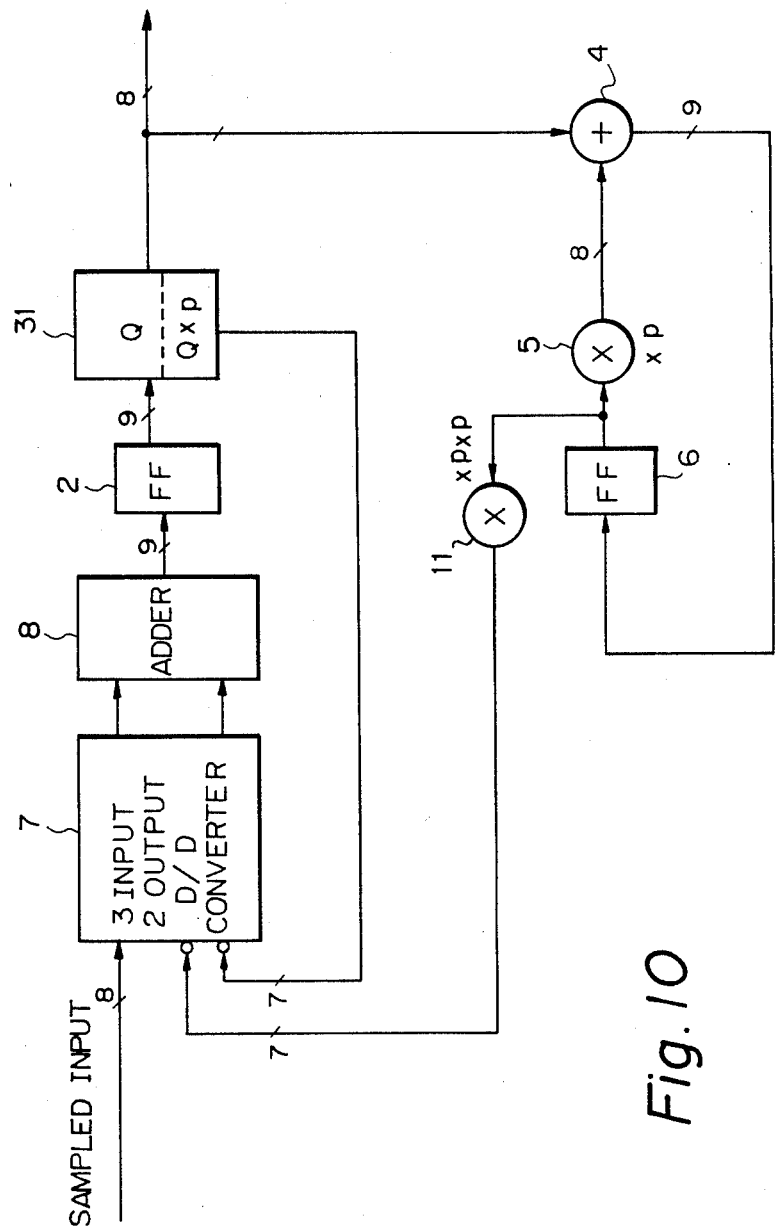

FIG. 10 shows another embodiment of the differential coding circuit according to the present invention. This circuit has an operation speed even faster than that of the FIG. 3 circuit. The improvements over the FIG. 3 circuit are as follows. First, instead of the quantizer 3, a quantizer 31 outputting two output signals is used. That is, this quantizer 31 outputs, on one hand, the quantized differential signal Q and, on the other hand, an output signal $p \times Q$ corresponding to the value obtained by multiplying the prediction coefficient p by the quantized differential signal Q in response to the differential signal D input from the flip-flop 2. Further, the multiplier 9 of FIG. 3 is eliminated, and the output terminal of the quantizer 31 and the input terminal of the D/D converter 7 are directly connected. The quantizer 31 may be constituted by a read-only memory (ROM), random-access memory (RAM), programmable logic array (PLA), etc. The output bits are divided into two output portions; one for the signal Q, the other for the signal $p \times Q$. Different data, i.e., Q and $p \times Q$, are stored in the storing regions of the two output portions with respect to tone input signal, i.e., one input address.

Second, in order to shorten the operation time in the case of the signal path from the flip-flop 2 via the adder 4 to the flip-flop 6, the positions of the multiplier 5 and the flip-flop 6 of FIG. 3 are reversed. Further, the output signal of the flip-flop 6 is and input, on one hand, to the adder 4 via a multiplier 5, which multiplies it with the prediction coefficient p, and, on the other hand, to an inverting input of the D/D converter 7 via a multiplier 11, which multiplies it with the square of the prediction coefficient p.

As clear from the drawings, the circuit of FIG. 10 is equivalent to the circuit of FIG. 3 in function in spite of the modification described above.

Regarding the operation speed of the FIG. 10 circuit, the circuit has the following signal paths: a first path from the flip-flop 2 via the quantizer 31, the D/D converter 7, and the adder 8 back to the flip-flop 2; a second path from the flip-flop 2 via the quantizer 1 and the adder 4 to the flip-flop 6; and a third path from the flip-flop 6 via the multiplier 11, the D/D converter 7, and the adder 8 to the flip-flop 2. When the multiplier 11 is faster than the quantizer 31, the critical path of the FIG. 10 circuit is the first path. Comparing this critical path of FIG. 10 with that of FIG. 3, the operation speed of the former is faster than that of the latter by a delay time of the multiplier 9.

Figure 11:
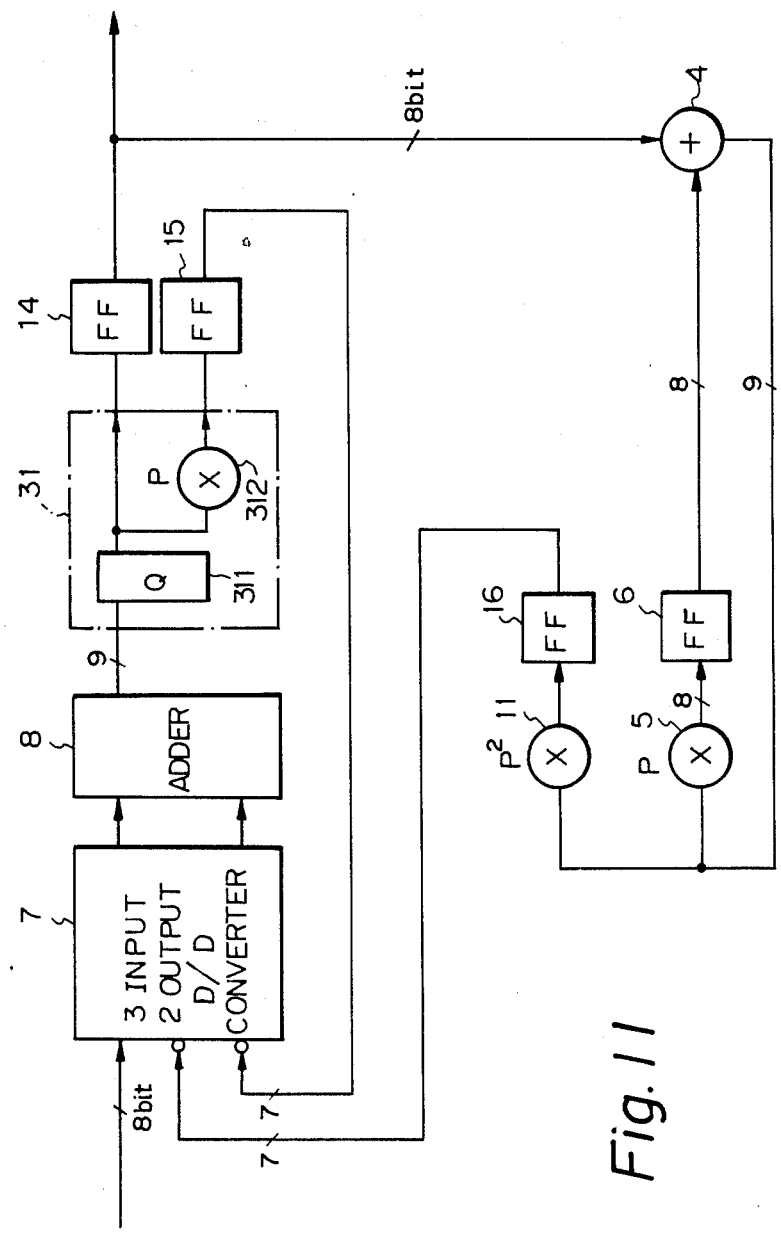

FIG. 11 shows a further embodiment of the differential coding circuit according to the present invention. Again, the operation speed is faster than that of the FIG. 3 circuit. The improvements over the FIG. 3 circuit are as follows.

Figure 19:
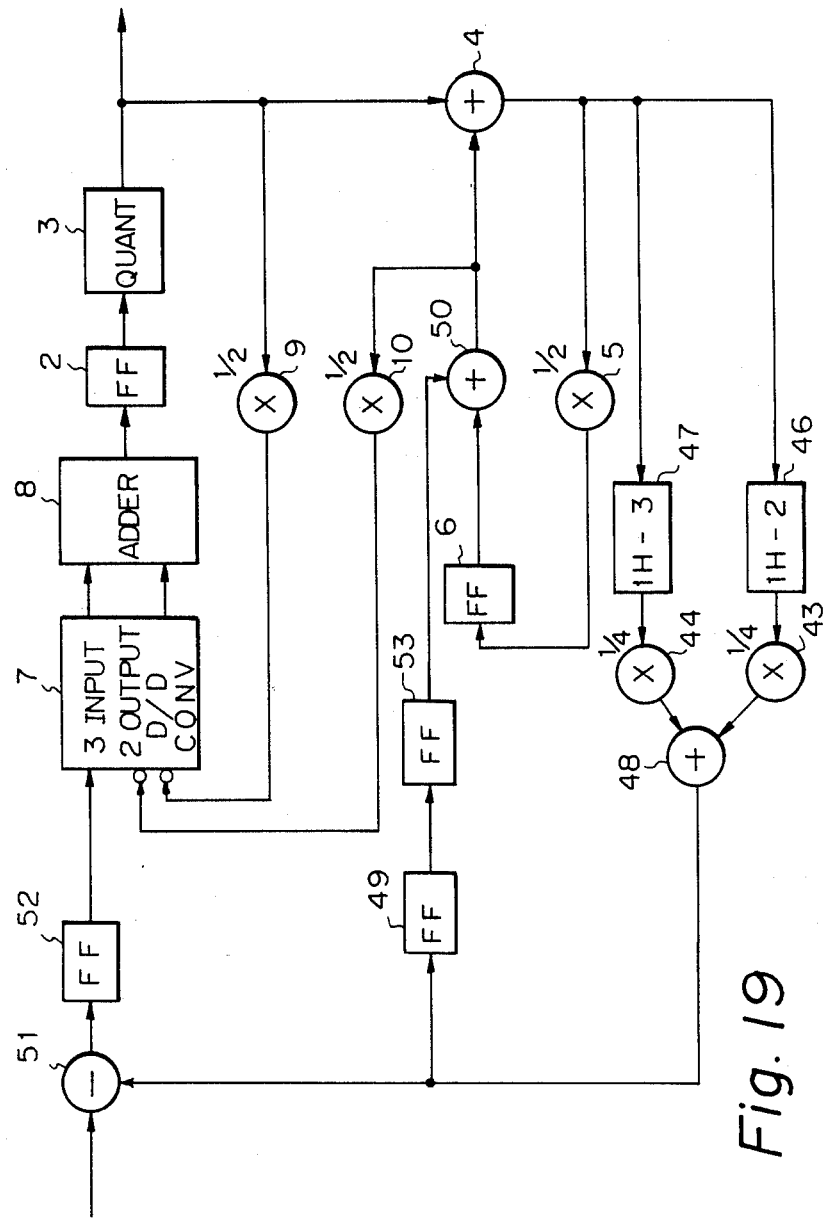
FIG. 19 and FIG. 20 are block diagrams of differential coding circuits of the present invention used in picture bandwidth compression coding devices.

First, the quantizer 31, unlike that of FIG. 19, is directly connected just after the adder 8. The quantized differential signal Q from the quantizer 31 is input into the transmitting circuit 103 and the adder 4 via a flip-flop 14. The signal $p \times Q$, obtained by multiplying the quantized differential signal Q by the prediction coefficient p, is inverted and input into the D/D converter 7 via a flip-flop 15. The quantizer 31 is in practice constituted by a ROM, RAM, PLA, etc., as described above. In FIG. 11, however, the quantizer 31 is represented by an equivalent functional block diagram comprising a quantizing portion 311 and a multiplying portion 312.

Further, in order to shorten the transmission time of the path from the flip-flop 6 to the flip-flop 2 of FIG. 3, the multiplier 10 is eliminated. Instead, the output signal of the adder 4 is inverted and input into the D/D converter 7 via the multiplier 11, which multiplies it with a square of the prediction coefficient p, and a flip-flop 16. The FIG. 11 circuit is equivalent with the FIG. 3 circuit in function.

Regarding the operation speed of the FIG. 11 circuit, the circuit has the following signal paths: a first path from the flip-flop 15 via the D/D converter 7, the adder 8, and the quantizer 31 back to the flip-flop 15; a second path from the flip-flop 14 via the adder 4 to the multiplier 5 and the flip-flop 6 or to the multiplier 11 to the flip-flop 16; and a third path from the flip-flop 16 via the D/D converter 7, the adder 8, the quantizer 31 to the flip-flop 14 or 15. In this case, the critical path is the first path or the third path. Therefore, compared with the FIG. 3 circuit, the FIG. 11 circuit is faster by the delay time at the multiplier 9 or 10.

It is possible to modify the FIG. 11 circuit. For example, the quantizer 31 and the flip-flops 14 and 15 may be formed by a single registered ROM having both functions.

Figure 12:
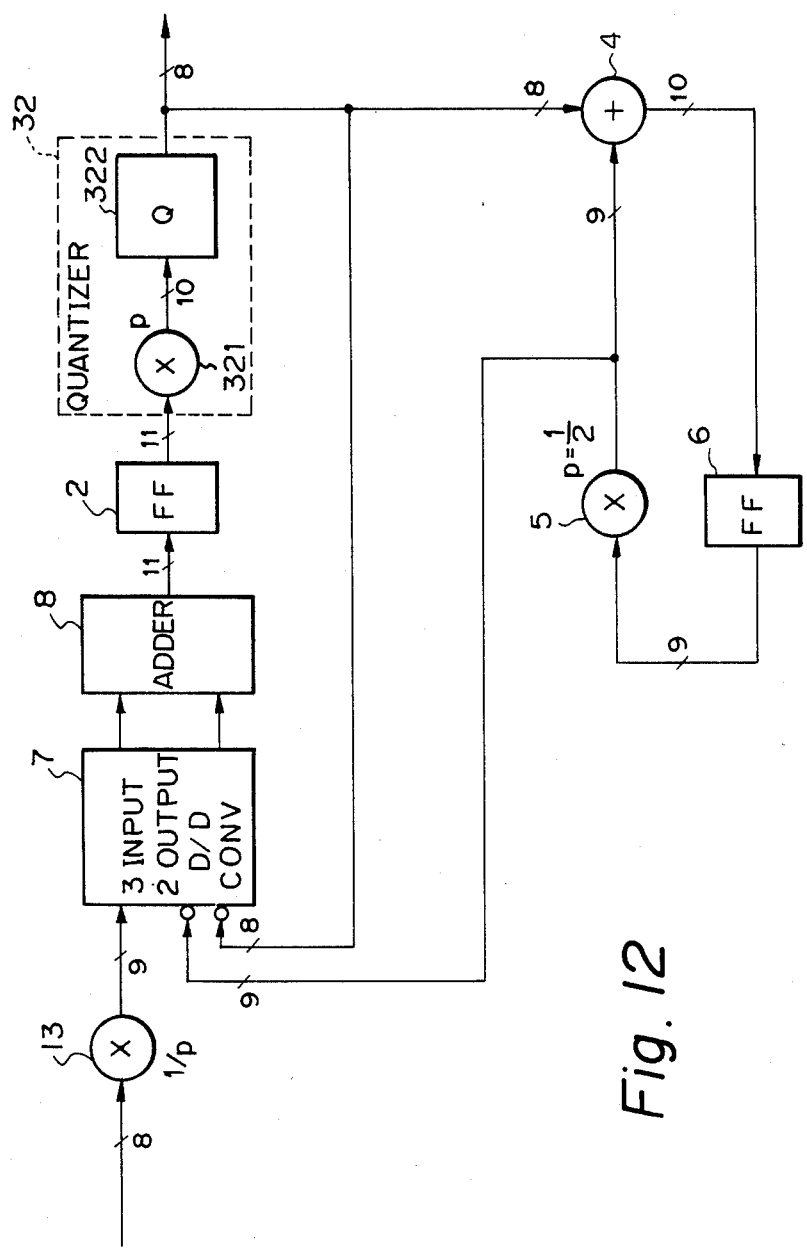

FIG. 12 shows a further embodiment of the differential coding circuit according to the present invention. Again, the operation speed is faster than that of the FIG. 3 circuit. The improvements over the FIG. 3 circuit are as follows. In the FIG. 12 circuit, the quantizer 3 is replaced by the quantizer 32, which functions to output the value obtained by quantizing the multiplied differential signal by the prediction coefficient p. Therefore, the multipliers 9 and 10 of the FIG. 3 circuit, which serve to multiply the prediction coefficient p, are eliminated. Further, a multiplier 13 for multiplying by the reciprocal 1/P of the prediction coefficient is provided in front of the D/D converter 7, so that the prediction coefficient p multiplied at the quantizer 32 is cancelled at the output terminal of the quantizer 32. The FIG. 12 circuit has an equivalent function with the FIG. 3 circuit.

Figure 13:
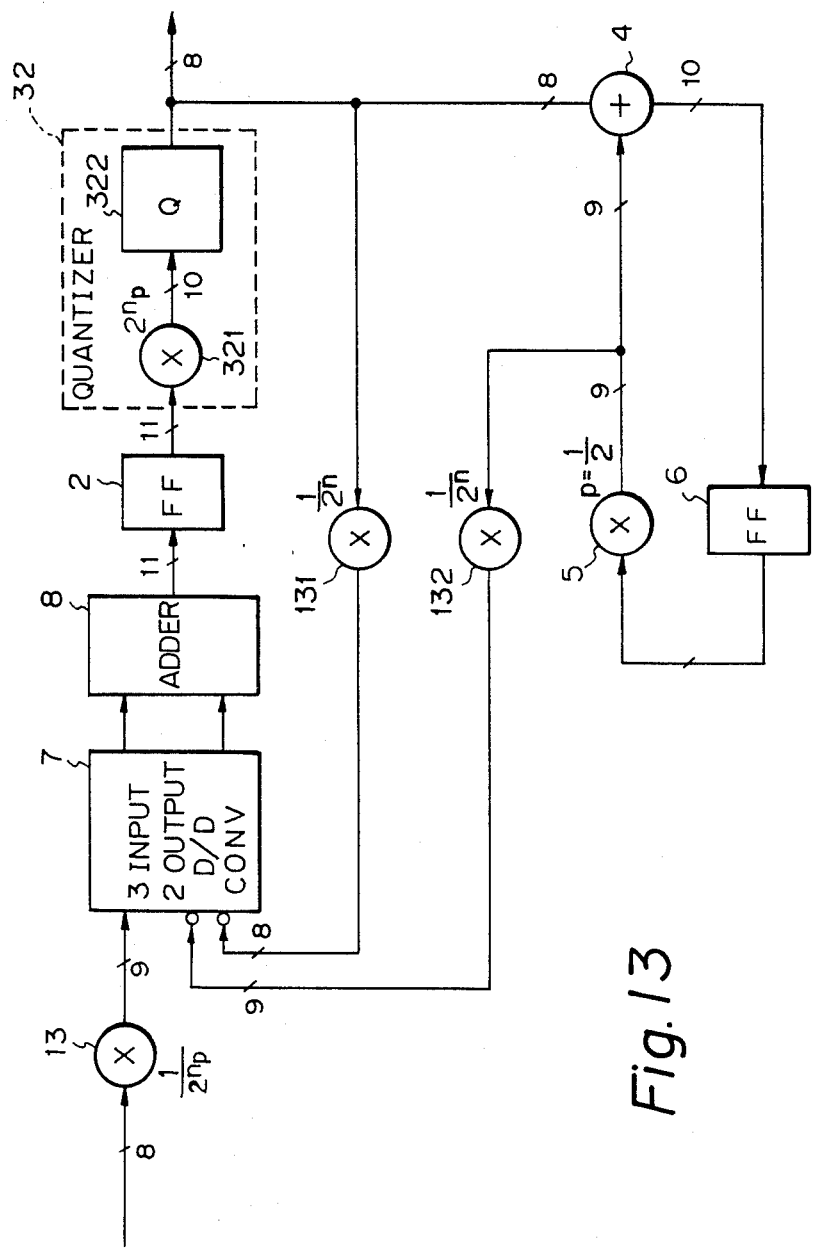

The quantizer 32 may be embodied by a RAM, ROM, PLA, etc. In FIG. 13, the quantizer 32 is represented by an equivalent functional block diagram containing a multiplying portion 321 and a quantizing portion 322.

Regarding the operation speed of the FIG. 12 circuit, the circuit has the following two paths: a first path from the flip-flop 2 via the quantizer 32, the D/D converter 7, and the adder 8 back to the flip-flop 2 and a second path from the flip-flop 2 to the flip-flop 6 via the quantizer 32, the adder 4, and the multiplier 5.

When the multiplier 5 is faster than the quantizer 32, the critical path is the first path. Comparing this critical path with that of FIG. 3, the operation speed for the prediction of the FIG. 12 circuit is faster than that of the FIG. 3 circuit by the delay time of the multiplier 9.

Further, the FIG. 12 circuit may be modified. For example, the positions of the flip-flop 2 and the quantizer 32 may be reversed. Also, the positions of the multiplier 5 and the flip-flop 6 may be reversed. In the former case, if the delay time of the multiplier 5 is zero (i.e., bit shift) or the position of the multiplier 5 and the flip-flop 6 are reversed, the critical path is the path from the flip-flop 2 via the D/D converter 7, the adder 8, and the quantizer 32 back to the flip-flop 2. Similarly, in the latter case, if the delay time of the multiplier 5 is smaller than that of the D/D converter 7, the critical path is the path from the flip-flop 2 via the quantizer 32, the D/D converter 7, and the adder 8 back to the flip-flop 2. In each case, the operation speed for the prediction of the circuit is faster than that of the FIG. 3 circuit by the delay time of the multiplier 9.

FIG. 13 shows a further embodiment of the present invention, which improves the differential coding circuit of FIG. 12. That is, in the FIG. 12 circuit, if the prediction coefficient p of the multiplier 5 is small, the number of output bits of the multiplier 13 increases. Accordingly, the delay time of the adder 8 increases, therefore the delay time of the critical path increases. As a result, the operation speed of the FIG. 12 circuit becomes low.

The circuit of FIG. 13 is provided to solve this problem. In FIG. 13, the coefficient of the multiplier 13 is selected as $\frac{1}{2}^n p$, where n is an integer more than one, and p is the prediction coefficient of the multiplier 5. In accordance with this change, the coefficient of the multiplying portion 321 of the quantizer 32 is selected to $2^n p$, a multiplier 131 is inserted between the quantizer 32 and the D/D converter 7, and a multiplier 132 is inserted between the multiplier 5 and the D/D converter 7. The coefficients of the multipliers 131 and 132 are selected as $\frac{1}{2}^n$.

In this circuit, due to the low coefficient of the multiplier 13, the number of output bits of the multiplier 13 does not increase, therefore the delay time of the adder 8 does not increase. Further, when the coefficients of the multipliers 131 and 132 are $\frac{1}{2}^n$, they may be constituted by a "bit shift", which has no delay time. As a result, the delay time of the critical path of FIG. 13 is almost the same as that of FIG. 12 even though the prediction coefficient p of the multiplier 5 is small.

Figure 14:
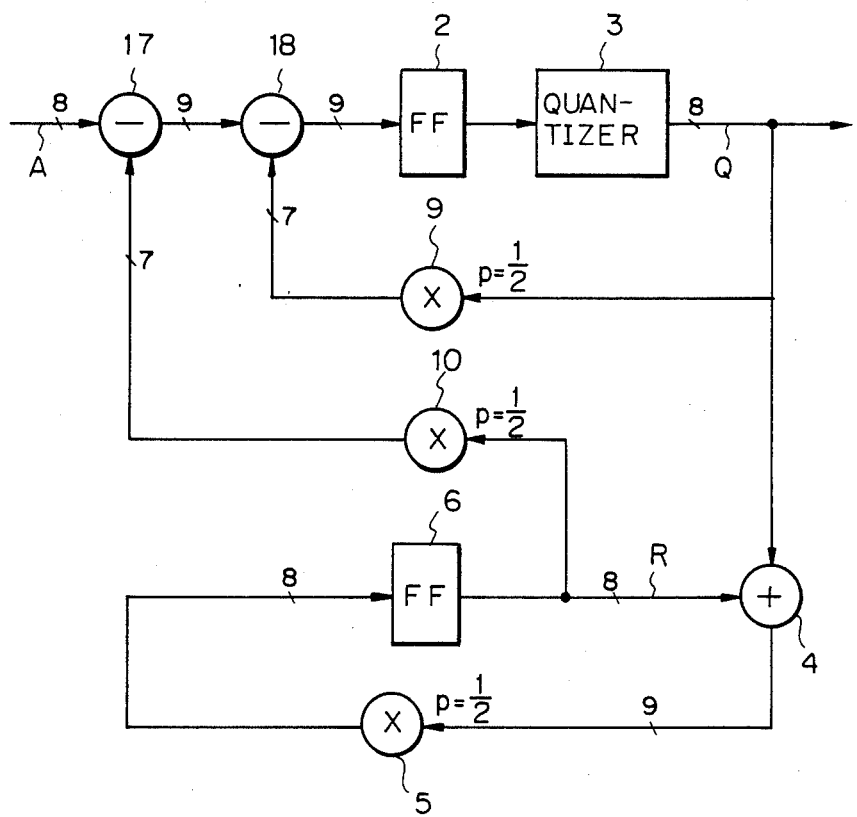
Figure 17:
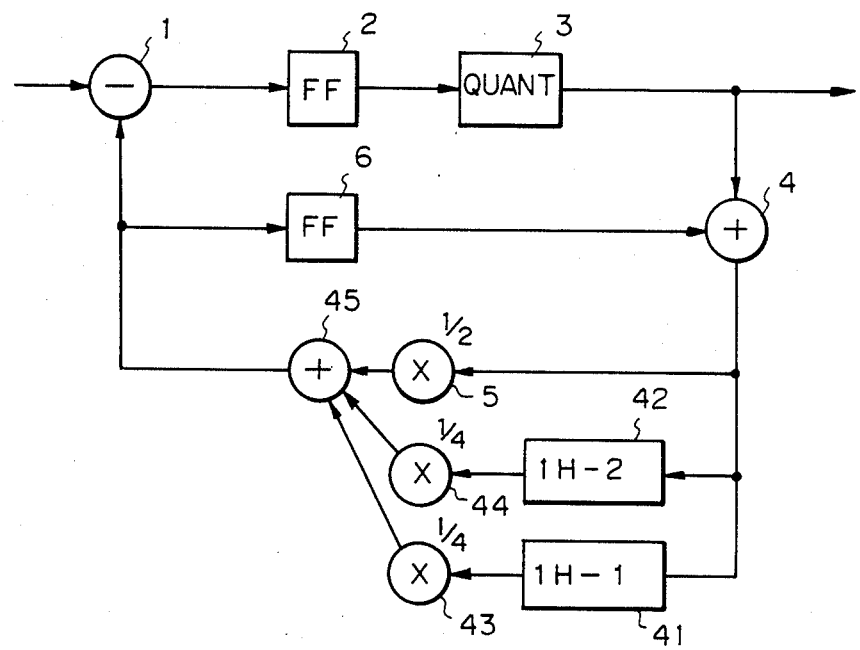
FIG. 17 is a block diagram of the difference coding circuit of the prior art used in a picture bandwidth compression coding device.
Figure 18:
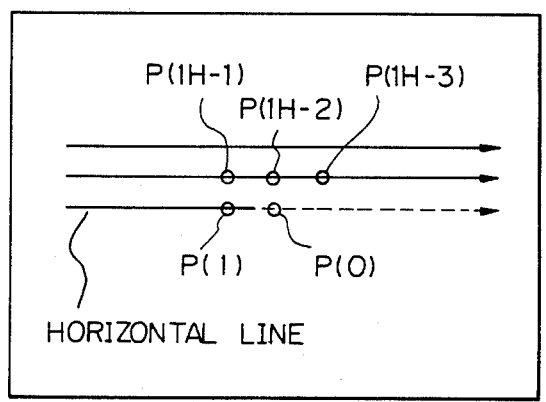
FIG. 18 shows the relationship of predicted signals in a picture frame.

FIG. 14 shows another embodiment of the differential coding circuit according to the present invention. The operation speed is faster than that of the FIG. 2 circuit. In FIG. 14, 17 and 18 are subtracters, and 9 and 10 are multipliers for multiplying the prediction coefficient p (in this example, $p = \frac{1}{2}$). The improvements over the FIG. 2 circuit are as follows. An output signal of the flip-flop 6 corresponding to the prior predicted signal from before one sampling period earlier is multiplied by the prediction coefficient p at the multiplier 10, then input to the subtracter 17. The subtracter 17 calculates the differential value between the sampled input signal and the output signal from the multiplier 10. The quantized differential signal output from the quantizer 3 is multiplied by the prediction coefficient p at the multiplier 9, then input to the subtracter 18. The subtracter 18 calculates the differential value between the output signals of the multiplier 9 and the subtracter 17, then outputs it to the quantizer 3 via the flip-flop 2.

That is, in FIG. 2, the output signals of the quantizer 3 and the flip-flop 6 are added at the adder 4, multiplied with the prediction coefficient p at the multiplier 5 to make the predicted signal, then subtracted from the sampled input signal at the subtracter 1. On the other hand, in FIG. 14, the output signal of the quantizer 3 and that of the flip-flop 6 are multiplied by the prediction coefficient p separately at the multipliers 9 and 10, respectively, then subtracted from the sampled input signal A separately at the subtracters 17 and 18. As a result, the FIG. 14 circuit functions equivalently to the FIG. 2 circuit.

The critical path determining the operation speed is the path from the flip-flop 2 via the quantizer 3, the multiplier 9, and the subtracter 18 back to the flip-flop 2. Compared with the FIG. 2 circuit, the FIG. 14 circuit is faster by the delay time of the adder 8.

In this circuit of FIG. 14, the constitution of the adder 4, the multiplier 5, the flip-flop 6, and the multiplier 10 can be modified in the same manner as described in FIGS. 5 through 9. Also, the positions of the flip-flop 2 and the quantizer 3 can be reversed as in the above described modifications.

Figure 15:
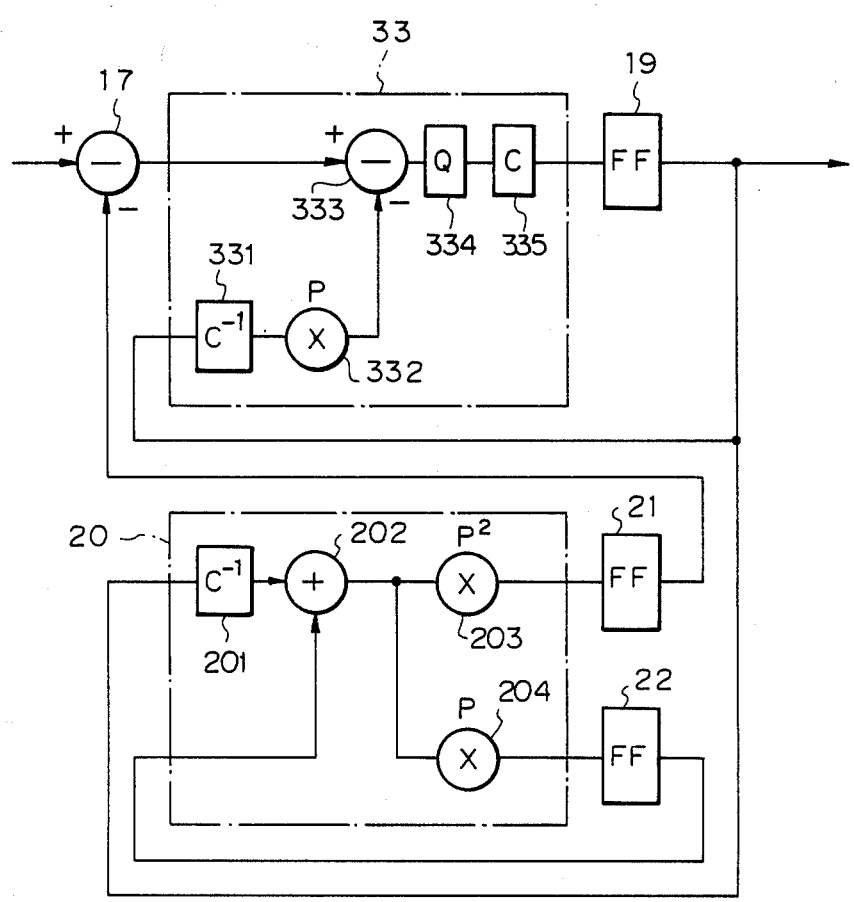

FIG. 15 shows another embodiment of the differential coding circuit according to the present invention. The operation speed is increased in comparison with the FIG. 14 circuit. In FIG. 15, the sampled input signal is input to the subtracter 17. The output terminal of the subtracter 17 is connected to one of the input terminals of the quantizer 33, while the output terminal of the quantizer 33 is connected to the other input terminal via the flip-flop 19. The output terminal of the flip-flop 19 is also connected to one of the input terminals of a code converting circuit 20. The code converting circuit 20 has two output terminals, one of which is connected to the subtracted input terminal of the subtracter 17 via a flip-flop 21, and the other of which is connected to the other input terminal of the circuit 20 via a flip-flop 22. The flip-flops 21 and 22 delay the input signal by one sampling period.

The quantizer 33 and the code converting circuit 20 are constituted by a ROM, RAM, PLA, etc. and are illustrated by equivalent function block diagrams in FIG. 15. That is, the function of the quantizer 33 is represented equivalently by a reverse converting portion 331 which reverse converts the output signal from the flip-flop 19 to restore the number of bits, a multiplying portion 332, which multiplies the output signal of the reverse converting portion 331 by the prediction coefficient p (for example, $\frac{1}{2}$), a subtracting portion 333, which subtracts the output signal of the multiplying portion 332 from the output signal of the subtracter 17, a quantizing portion 334, which quantizes the differential output signal of the subtracting portion 333, and a converting portion 335, which code-converts the quantized differential signal of the quantizing portion 334 to reduce the number of bits.

The function of the code-converting circuit 20 is represented equivalently by a reverse converting portion 201, which reverse converts the output signal of the flip-flop 19, an adding portion 202, which adds the output signal of the reverse converting portion 201 and the output signal of the flip-flop 22, a multiplying portion 203, which multiplies the output signal of the adding portion 202 by a square value $p^2$ of the prediction coefficient, and a multiplying portion 204, which multiplies the output signal of the adding portion 202 by the prediction coefficient p.

The FIG. 15 circuit functions equivalently to the FIG. 14 circuit. In this case, the critical path of FIG. 15 is a path from the flip-flop 21 via the subtracter 17 and the quantizer 33 to the flip-flop 19. Comparing FIG. 15 with the FIG. 14, since the operation speeds of the quantizers 3 and 33 and the subtracters 17 and 18 are almost equal, the FIG. 15 circuit operates faster by the delay time of the multiplier 9.

Figure 16:
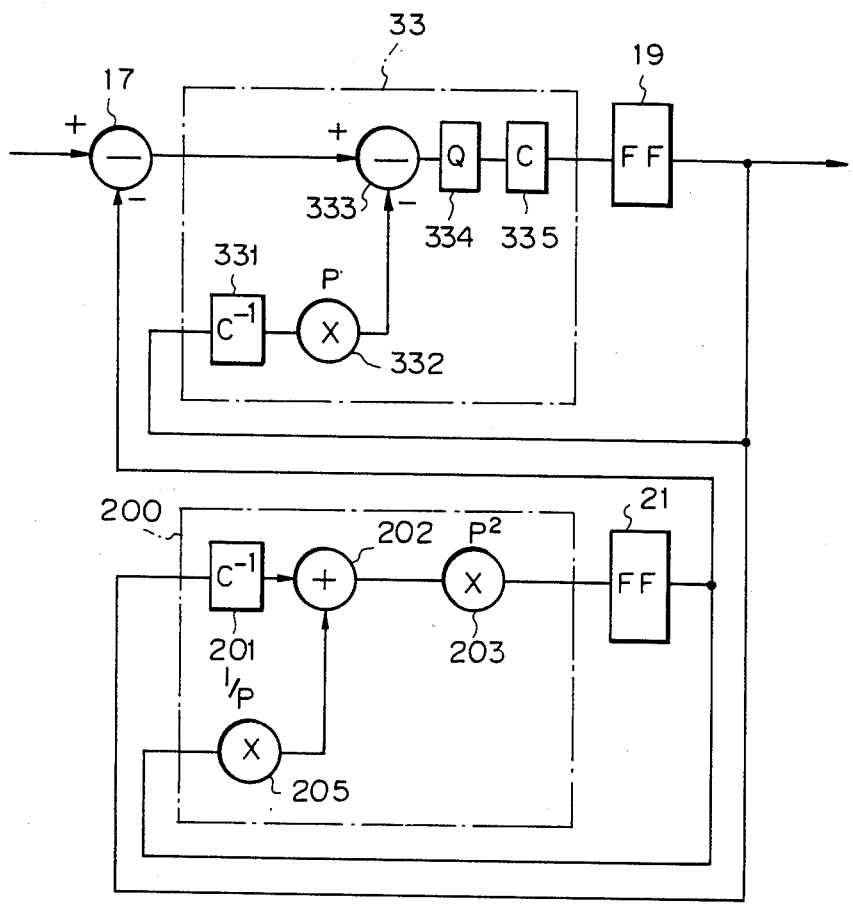

FIG. 16 shows a modification of the FIG. 15 circuit. The FIG. 16 circuit has a code-converting circuit different from that of the FIG. 15 circuit. That is, in FIG. 16, the code-converting circuit 200 is represented by an equivalent function block diagram including the inverting portion 201, a multiplying portion 205, which multiplies the output signal of the flip-flop 22 by the reciprocal $p^{-1}$ of the prediction coefficient, i.e., the p, adding portion 202, and the multiplying portion 203. This FIG. 16 circuit increases the operation speed by the same amount as the FIG. 15 circuit.

Further, for example, in FIG. 15, the quantizer 33, the flip-flops 19, 21, and 22, and the code-converting circuit 20 are separately constituted. However, the quantizer 33 and the flip-flop 19 or the code-converting circuit 200 and the flip-flops 21 and 22 can be formed by a single registered ROM. The same may be said in the case of FIG. 16.

An explanation will now be made of an example of the use of the differential coding circuit of the present invention. The example refers to use in a picture bandwidth compression coding device which can effect prediction within a field, between fields, and between frames.

For ease of understanding, an explanation of a use of a differential coding circuit of the prior art in a picture bandwidth compression coding device will first be given with reference to FIG. 17.

FIG. 17 shows a plane (two-dimensional) predictive coding circuit of the prior art. In FIG. 17, reference numerals 1 through 6 indicate the same elements as in FIG. 2. Reference numerals 41 and 42 are delay circuits which store respectively the predicted value P(1H−1), and the predicted value P(1H−2) of one horizontal scanning line before the current frame, as shown in FIG. 18, where P(0) represents a current predicted value. Reference numerals 43 and 44 are multipliers which multiply the output signals of the delay circuits 41 and 42 by the prediction coefficient ¼, respectively, and reference numeral 45 is an adder which adds the output signals of the multipliers 5, 13, and 14 and outputs a summed value to the subtracter 1 and the flip-flop 6.

The mode of operation of the FIG. 17 circuit will be now explained. A predicted signal P(1) of one sampling period before output from the adder 4, the predicted signal P(1H−2) of one horizontal scanning line before of the current input signal delayed at the delay circuit 41, and the predicted signal P(1H−1) of one sampling period before the predicted signal P(1H−2) delayed at the delay circuit 42 are multiplied by the prediction coefficients ½, ¼, and ¼ and at the multipliers 5, 43, and 44 respectively, for weighting thereof. These signals are then added by the adder 45 so as to obtain the predicted signal P(0). The subtracter 1 subtracts this predicted signal P(0) from a sampled input signal of the pixel and outputs a differential signal to the quantizer 3 via the flip-flop 2, which delays the differential signal by one sampling period. The quantizer 3 quantizes the differential signal and outputs the quantized differential signal (or DPCM signal).

The critical path of the FIG. 17 circuit is a path from the flip-flop 2 via the quantizer 3, the adder 4, the multiplier 5, the adder 45, and the subtracter 1 back to the flip-flop 2. In order to increase the operation speed of the FIG. 17 circuit in the prior art, it has been necessary to constitute the circuit by a special device, for example, an emitter coupled logic (ECL) device. However, when the characteristics of the quantizer and/or multipler are complicated, such a circuit cannot be realized even if an ECL device is used.

FIG. 19 shows a high-speed plane predictive coding circuit (or DPCM circuit) according to the present invention. In FIG. 19, reference numerals 2 to 10 indicate the same elements as in FIG. 3. Reference numerals 46 and 47 are delay circuits with delay times one sampling period smaller than those of the delay circuits 41 and 42 of FIG. 17, respectively. Reference numerals 48 and 50 are adders, blocks 49, 52 and 53 are flip-flops, used as the delay circuit for one sampling period delay, and reference numeral 51 is a subtracter.

The operation of the FIG. 19 circuit will be described hereinafter. The delay circuits 46 and 47 store the predicted signal P(1H−2) and the predicted signal P(1H−3) which is one sampling period later than the delay circuits 41 and 42, respectively. These output signals of the delay circuits 46 and 47 are multiplied by the prediction coefficient ¼ at the multipliers 43 and 44, respectively, and then added to each other at the adder 48. The subtracter 51 obtains the differential value between the summed value of the adder 48 and the sampled input signal. This differential value is input to the D/D converter 7 via the flip-flop 52. Having a delay time of one sampling period. At the same time, the summed value of the adder 48 is input to the adder 50 via the flip-flops 49 and 53, also having a delay time of one sampling period, so as to be added to the output signal of the flip-flop 6. Then, the summed signal of the adder 50 is input to the adder 4. By this, the FIG. 19 circuit is made equivalent to the FIG. 17 circuit.

In FIG. 19, there are the following signal paths which must be investigated to determine the operation speed of the circuit: a first path from the flip-flop 2 via the quantizer 3, the multiplier 9, the D/D converter 7, and the adder 8 back to the flip-flop 2 and a second path from the flip-flop 6 via the adder 50, the multiplier 10, the D/D converter 7 and the adder 8 to the flip-flop 2. When the delay time of the adder 50 is less than that of the quantizer 3, the critical path is the first path, as in the FIG. 3 circuit, and the operation speed is not increased due to the second path. Consequently, the operation speed of the FIG. 19 circuit is faster than that of the FIG. 17 circuit without using a special device such as an ECL device.

Figure 20:
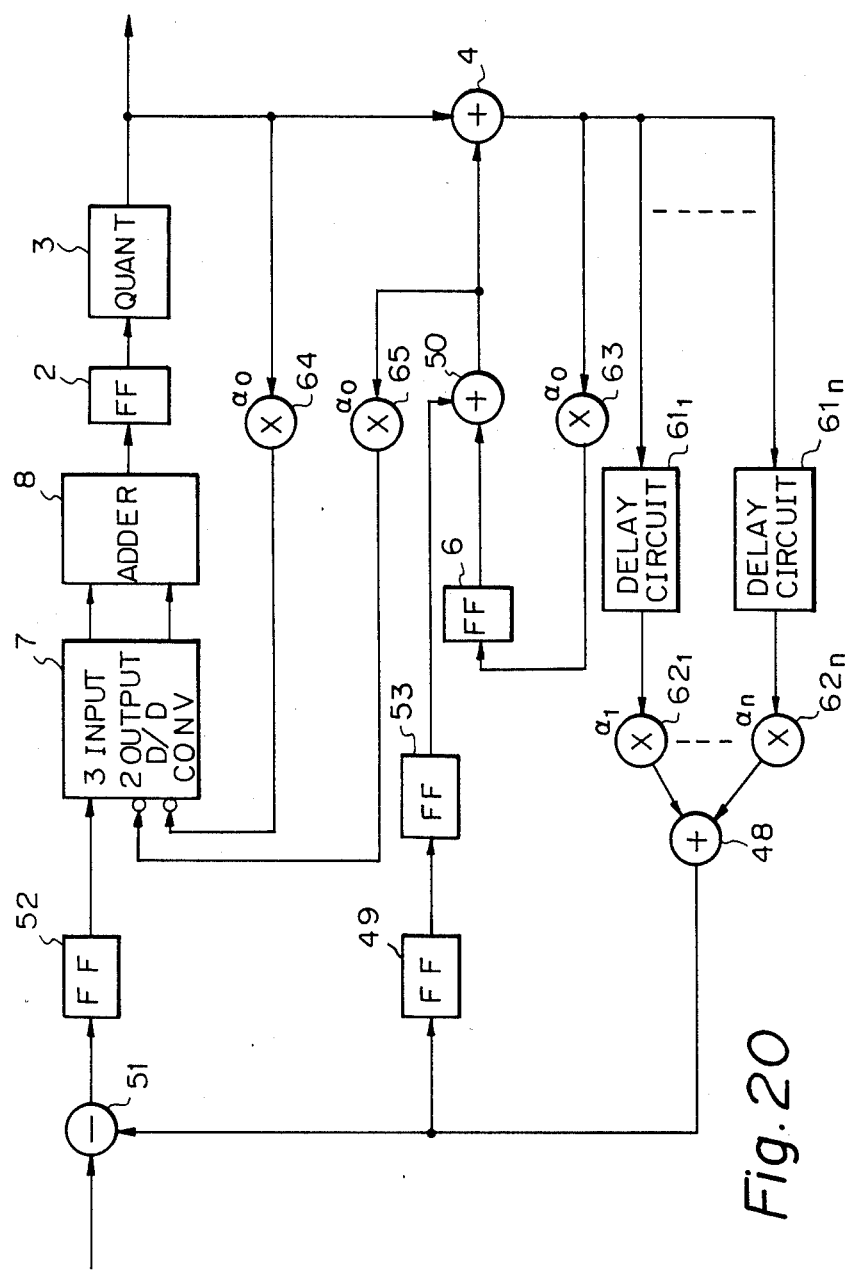

FIG. 20 is a general block diagram of a differential coding circuit used in a picture bandwidth compression coding device according to the present invention. In FIG. 20, the output values of the delay circuits $61_1$ to $61_n$, corresponding to a pixel value of the same line, a pixel value of the same field, a pixel value of a differential field, a pixel value of a same frame, a pixel value of a different frame, etc. are multiplied by the weighted prediction coefficient $a_1$ to $a_n$ at the multipliers $62_1$ to $62_n$ respectively. These values are then added at the adder 48. The summed value of the adder 48 is input into the subtracter 51. The output value of the adder 4, almost equal to the input value of two sampling periods before, is multiplied by the prediction coefficient $a_0$ at a multiplier 63. Also, multipliers 64 and 65 multiply the input signal by the prediction coefficient $a_0$.

Although the circuits of FIGS. 19 and 20 utilize the circuit of FIG. 3, however, the circuit of FIG. 14 may also be utilized in similar applications.

All embodiments described above relate to linear prediction and were explained on the supposition that the prediction coefficient p was linear. Therefore, in these embodiments, the predictor was constituted only by means of a multiplier, for example, the multipliers 5, 9, 10, or 11. However, the predictor is not limited to a multiplier when linear prediction is effected, for example, it may be realized by means of a "bit shift".

Further, the present invention can be applied to non-linear prediction if the following condition regarding the signals Q and R of, for example, FIG. 3 is satisfied:

$$p(R+Q) \simeq pR + pQ$$

In a such case, the multiplier for prediction described above can be replaced by predicting means constituted by a combination of the gates, ROM, RAM, PLA, etc.

Further, when the present invention is applied to the differential coding circuit effecting adaptive quantizing (or ADPCM), the quantizer and/or predictor may have a control input which changes the characteristics of the quantizer and/or predictor.

Although preferred embodiments have been described heretofore, various modifications and alterations are possible within the scope of the present invention.

What is claimed is:

1. A differential coding circuit, comprising:
    subtracting means for effecting subtraction on an input signal to quantized to produce a differential signal;
    quantizing means for quantizing the differential signal produced by said subtracting means and for outputting a quantized differential signal;
    product means for supplying a quantized product to said subtracting means, the quantized product formed by multiplying the quantized signal by a prediction coefficient; and
    prediction means for generating a first predicted signal on the basis of the quantized differential signal output from said quantized means without using the quantized product,
    said subtracting means including means for supplying a second predicted signal based on the first predicted signal and means for subtracting the quantized product supplied by said product means and the second predicted signal from the input signal to be quantized.

2. A differential coding circuit, comprising:
    subtracting means for subtracting first and second values from an input signal to be quantized to produce a differential signal;
    quantizing means for quantizing the differential signal to produce a quantized differential signal;
    prediction means for generating a predicted signal in dependence upon the quantized differential signal and a prediction coefficient;
    first supply means for supplying only the first value to said subtracting means, the first value corresponding to the quantized differential signal multiplied by the prediction coefficient; and
    second supply means for supplying only the second value to said subtracting means, the second value corresponding to the predicted signal multiplied by the prediction coefficient.

3. A differential coding circuit as recited in claim 2, wherein said subtracting means comprises:
    a three-input two-output digital-digital converter, having a first input terminal operatively connected to receive the input signal, a second input terminal operatively connected to receive the first value from said first supply means and a third terminal operatively connected to receive the second value from said second supply means, for outputting two output signals;
    an adder operatively connected to said digital-digital converter to receive the two output signals therefrom; and
    a delay element, operatively connected to said adder and said quantizing means, for outputting the differential signal to said quantizing means,
    wherein said quantizing means comprises a quantizer, operatively connected to said delay element, said prediction means and said first supply means, for generating the quantized differential signal, and
    wherein said first supply means comprises a predictor, operatively connected to said quantizer, for multiplying the quantized differential signal from said quantizer by the prediction coefficient to produce the first value supplied to said digital-digital converter.

4. A differential coding circuit as recited in claim 3, wherein said subtracting means comprises:
    a three-input two-output digital-digital converter, having a first input terminal operatively connected to receive the input signal, a second input terminal operatively connected to receive the first value from said first supply means and a third input terminal operatively connected to receive the second value from said second supply means, for outputting two output signals; and
    an adder, operatively connected to said digital-digital converter to receive the two output signals therefrom,
    wherein said quantizing means comprises:
        a quantizer, operatively connected to said adder, for generating the quantized differential signal; and
        a delay element, operatively connected to said quantizing means, said first supply means and said prediction, for delaying and outputting the quantized differential signal, and
    wherein said first supply means comprises a predictor, operatively connected to said delay element, for multiplying the quantized differential signal from said delay element by the prediction coefficient to produce the first value supplied to said digital-digital converter.

5. A differential coding circuit as recited in claim 2, wherein said subtracting means comprises:
    a three-input two-output digital-digital converter, having a first input terminal operatively connected to receive the input signal, a second input terminal operatively connected to receive the first value from said first supply means and a third input terminal operatively connected to receive the second value from said second supply means, for outputting two output signals;

an adder, operatively connected to said digital-digital converter to receive the two output signals therefrom; and a delay element, operatively connected to said adder and said quantizing means, for outputting the differential signal to said quantizing means; and wherein said quantizing means comprises a quantizer, operatively connected to the said delay element, said prediction means and said first supply means, for generating the quantized differential signal and the first value, said quantizer outputting the quantized differential signal to said prediction means and the first value to said first supply means.

6. A differential coding circuit as recited in claim 5, wherein said quantizer comprises one of a read only memory, a random access memory, a programmable logic array and programmable array logic.

7. A differential coding circuit as recited in claim 2, wherein said subtracting means comprises:
a three-input two-output digital-digital converter, having a first input terminal operatively connected to receive the input signal, a second input terminal operatively connected to receive the first value from said first supply means and a third input terminal operatively connected to receive the second value from said second supply means, for outputting two output signals; and
an adder, operatively connected to said digital-digital converter to receive the two output signals therefrom, wherein said quantizing means comprises:
a quantizer, operatively connected to the said adder, for generating the quantized differential signal and the first value; and delay means, operatively connected to said quantizing means, said first supply means and said prediction means, for delaying and outputting the quantized differential signal to said prediction means and the first value to said first supply means.

8. A differential coding circuit as recited in claim 7, wherein said quantizer comprises at least one of a read only memory, a random access memory, a programmable logic array and programmable array logic.

9. A differential coding circuit as recited in claim 2, wherein said subtracting means comprises:
a first subtracter, operatively connected to said second supply means and to receive the input signal, for subtracting the second value from the input signal to produce a subtracted signal;
a second subtracter, operatively connected to said first subtracter and said first means, for subtracting the first value supplied by said first supply means from the subtracted signal output by said first subtracter; and
a delay element operatively connected to said second subtracter and said quantizing means, for outputting the differential signal to said quantizing means wherein said quantizing means comprises a quantizer, operatively connected to the said delay element, said prediction means and said first supply means, for generating the quantized differential signal, and wherein said first supply means comprises a predictor, operatively connected to said quantizer for multiplying the quantized differential signal from said quantizer by the prediction coefficient to produce the first value supplied to said second subtracter.

10. A differential coding circuit as recited in claim 2, wherein said subtracting means comprises:
a first subtracter, operatively connected to said second supply means and to receive the input signal, for subtracting the second value from the input signal to produce a subtracted signal; and
a second subtracter, operatively connected to said first subtracter and said first suppply means, for subtracting the first value supplied by said first supply means from the subtracted signal output by the first subtracter, wherein said quantizing means comprises:
a quantizer, operatively connected to the said second subtracter, for generating the quantized differential signal; and
a delay element, operatively connected to said quantizing means, said first supply means and said prediction means, for outputting the quantized differential signal, and wherein said first supply means comprises a first predictor, operatively connected to said delay element for multiplying the quantized differential signal from said delay element by the prediction coefficient to produce the first value supplied to said second subtracter.

11. A differential coding circuit as recited in claim 2, wherein said prediction means comprises a prediction signal generating loop including—
an adder, operatively connected to said quantizing means, for adding a prior predicted signal to the quantized differential signal to produce a sum,
a first predictor, operatively connected to said adder, for multiplying the sum output from said adder by the prediction coefficient to produce the predicted signal, and
a delay element, operatively connected to said first predictor, said adder and said second supply means, for delaying the predicted signal output by said first predictor and supplying the prior predicted signal to said adder and said second supply means, and wherein said second supply means comprises a second predictor, operatively connected to said delay element and said subtracting means, for multiplying the output from said delay element by the prediction coefficient to produce the second value supplied to said subtracting means.

12. A differential coding circuit as recited in claim 2, wherein said prediction means comprises a prediction signal operating loop including
an adder, operatively connected to said quantizing means, for adding a prior predicted signal to the quantized differential signal to produce a sum,
a first predictor, operatively connected to said adder and said second supply means, for multiplying the sum output from said adder by the prediction coefficient to produce the predicted signal, and
a delay element, operatively connected to said first predictor and said adder, for delaying the predicted signal output by said first predictor and supplying the prior predicted signal to said adder, and wherein said second supply means comprises:
   a second predictor, operatively connected to said first predictor, for multiplying the predicted signal from said first predictor by the prediction coefficient to produce the second value; and
   a second delay element, operatively connected to said second predictor and said subtracting means, for delaying the second value supplied to said subtracting means.

13. A differential coding circuit as recited in claim 2, wherein said prediction means comprises a prediction signal generating loop including—
   an adder, operatively connected to said quantizing means and said second supply means, for adding a prior predicted signal to the quantized differential signal to produce a sum,
   a first predictor, operatively connected to said adder, for multiplying the sum output from said adder by the prediction coefficient to produce the predicted signal, and
   a first delay element, operatively connected to said first predictor and said adder, for delaying the predicted signal output by said first predictor and supplying the prior predicted signal to said adder, and wherein said second supply means comprises:
   a second predictor, operatively connected to said adder, for multiplying the sum output from said adder by the prediction coefficient squared to produce the second value; and
   a second delay element, operatively connected to said second predictor and said subtracting means, for delaying the second value output from said second predictor.

14. A differential coding ciruit as recited in claim 2, wherein said prediction means comprises a prediction signal generating a loop including—
   an adder, operatively connected to receive the quantized differential signal from said quantizing means, for adding the predicted signal to the quantized differential signal to produce a sum,
   a first predictor operatively connected to said adder, for multiplying the sum output from said adder by the prediction coefficient squared to produce the second value,
   a delay element operatively connected to said predictor and said second supply means for delaying the second value output from said first predictor and providing an output to said second supply means, said second supply means supplying the output of said delay element to said subtracting means as the second value, and
   a second predictor, operatively connected to said delay element and said adder, for multiplying the output of said delay element by the reciprocal of the prediction coefficient to produce the predicted signal.

15. A differential coding circuit as recited in claim 2, wherein said prediction means comprises a prediction signal generating loop including
   an adder, operatively connected to receive the quantized differential signal from said quantizing means, for adding the predicted signal and the quantized differential signal to produce a sum,
   a delay element, operatively connected to said adder, for delaying the sum output from said adder to produce an output,
   a first predictor, operatively connected to said delay element, said adder and said second supply means, for multiplying the output from said first delay element by the prediction coefficient to produce the predicted signal, and wherein said second supply means comprises a second predictor, operatively connected to said first predictor and said subtracting means, for multiplying the predicted signal output from said first predictor by the prediction coefficient to produce the second value supplied to said subtracting means.

16. A differential coding circuit as recited in claim 2, wherein said prediction means comprises a prediction signal generating loop including—
   an adder, operatively connected to receive the quantized differential signal from said quantizer means, for adding the predicted signal and the quantized differential signal to produce a sum,
   a delay element, operatively connected to said adder, for delaying the sum output from said adder to produce an output,
   a first predictor, operatively connected to said delay element, said adder and said second supply means, for multiplying the output from said first delay element by the prediction coefficient to produce the predicted signal, and wherein said second supply means comprises a second predictor, operatively connected to said delay element, for multiplying the output from said delay element by the prediction coefficient squared to produce the second value supplied to said subtracting means.

17. A differential coding circuit as recited in claim 2, wherein said quantizing means comprises:
   a quantizer, operatively connected to said subtracting means, said quantizer including at least one of a read only memory, a random access memory, a programmable logic array and programmable array logic; and
   a delay element, operatively connected to said quantizer and said prediction means.

18. A differential coding circuit as recited in claim 2, wherein said quantizing means comprises a registered read only memory operatively connected to said subtraction means and said prediction means.

19. A differential coding circuit, comprising:
   product means for multiplying an input signal to be quantized by a reciprocal of the prediction coefficient times $2^n$, where n is zero or an integer greater than one, to produce a product;
   subtracting means for subtracting first and second values from the product output by said product means to produce a subtracted value;
   quantizing means for producing a differential signal corresponding to the subtracted value output by said subtracting means multiplied by the prediction coefficient times $2^n$ and for quantizing the differential signal to produce a quantized differential signal;
   prediction means for generating a predicted signal in dependence of the quantized differential signal and the prediction coefficient;
   first supply means for supplying the first value corresponding to the quantized signal multiplied by $\frac{1}{2}^n$; and second supply means for supplying the second value corresponding to the predicted signal multiplied by $\frac{1}{2}^n$.

20. A differential coding circuit as recited in claim 19, wherein said subtracting means comprises:
  a three-input two-output digital-digital converter, having a first terminal operatively connected to receive the input signal, a second input terminal operatively connected to receive the first value from said first supply means and a third input terminal operatively connected to receive the second value from said second supply means, for outputting two output signals; and
  an adder, operatively connected to said digital-digital converter, for adding the two output signals therefrom to produce a sum; and
  a delay element, operatively connected to said adder and said quantizing means, for delaying and outputting the sum to said quantizing means,
wherein said quantizing means comprises a quantizer, operatively connected to said delay element, said prediction means and said first supply means, for generating the quantized differential signal in dependence upon the subtracted value from said subtracting means multiplied by the prediction coefficient times $2^n$,
wherein said first supply means comprises a first multiplier, operatively connected to said quantizer, for multiplying the quantized differential signal from said quantizer by $\frac{1}{2}^n$ to produce the first value supplied to said digital-digital converter, and
wherein said second supply means comprises a second multiplier, operatively connected to said prediction means, for multiplying the predicted signal by $\frac{1}{2}^n$ to produce the second value supplied to said digital-digital converter.

21. A differential coding circuit as recited in claim 19, wherein said subtracting means comprises:
  a three-input two-output digital-digital converter, having a first input terminal operatively connected to receive the input signal, a second input terminal operatively connected to receive the first value from said first supply means and a third input terminal operatively connected to receive the second value from said second suppy means, for outputting two output signals; and
  an adder, operatively connected to said digital-digital converter, for adding the two output signals therefrom to produce a sum;
wherein said quantizing means comprises:
  a quantizer, operatively connected to said adder, for generating the quantized differential signal in dependence upon the subtracted value from said subtracting means multiplied by the prediction coefficient times $2^n$; and
  a delay element, operatively connected to said quantizing means, said prediction means and said first supply means, for delaying and outputting the quantized differential signal to the prediction means and said first supply means,
wherein said first supply means comprises a first multiplier, operatively connected to said quantizer, for multiplying the quantized differential signal from said quantizer by $\frac{1}{2}^n$ to produce the first value supplied to said digital-digital converter, and
wherein said second supply means comprises a second multiplier, operatively connected to said prediction means, for multiplying the predicted signal by $\frac{1}{2}^n$ to produce the second value supplied to said digital-digital converter.

22. A differential coding circuit, comprising;
  subtracting means for subtracting first and second values from an input signal to be quantized to produce a differential signal;
  quantizing means for quantizing the differential signal to produce a quantized differential signal;
  first prediction means for generating a first predicted signal in dependence upon the quantized differential signal and a prediction coefficient;
  second prediction means for generating a second predicted signal in dependence upon the quantized differential signal;
  first supply means for supplying the first value to said subtracting means, the first value corresponding to the quantized differential signal multiplied by the prediction coefficient;
  second supply means for supplying the second value to said subtracting means, the second value corresponding to a sum of the first and second predicted signals multiplied by the prediction coefficient.

23. A differential coding circuit, comprising:
  subtracting means for subtracting a value from an input signal to be quantized to produce a differential signal;
  quantizing means for producing a quantized differential signal in dependence upon the differential signal;
  a prediction circuit, including one of a read only memory, a randon access memory, a programmable logic array and programmable array logic, for producing a first output signal and a second output signal;
  a first delay element, operatively connected to receive the second output signal from said prediction circuit, for supplying a delayed second signal to said prediction circuit, said prediction circuit comprising the second output signal in dependence upon both the quantized differential signal and the delayed second signal;
  a second delay element, operatively connected to said prediction circuit and said subtracting means, for receiving the first output signal from said prediction circuit and supplying a delayed first output signal as the value to be subtracted by said subtracting means; and
  second supply means for supplying a previous value of the quantized differential signal to said quantizing means, said quantizing means producing the quantized differential signal in dependence upon the differential signal and the previous value of the quantized differential signal.

24. A differential coding circuit for quantizing an input signal to produce a differential signal, comprising:
  first, second and third signal lines for respectively transmitting a first value, a second value and the input signal;
  subtraction means having inputs, each of the inputs operatively connected to one of said first, second and third signal lines, for subtracting the first and second values from the input signal to produce a differential signal;
  quantizing means for quantizing the differential signal to produce a quantized differential signal;
  prediction means for generating a predicted signal in dependence upon the quantized differential signal and a prediction coefficient;

first supply means, operatively connected to said first signal line, for supplying the first value to said subtraction means via said first signal line, the first value corresponding to the quantized differential signal multiplied by the prediction coefficient; and second supply means, operatively connected to said second signal line, for supplying the second value to said subtraction means via said second signal line, the second value corresponding to the predicted signal multiplied by the prediction coefficient.

* * * * *

UNITED STATES PATENT AND TRADEMARK OFFICE
CERTIFICATE OF CORRECTION

PATENT NO. : 4,771,439
DATED : September 13, 1988
INVENTOR(S) : TAKESHI OKAZAKI et al.

It is certified that error appears in the above-identified patent and that said Letters Patent is hereby corrected as shown below:

[30]   "Dec. 14, 1985" should be --Dec. 14, 1984--;
       "60-263972" should be --59-263972--;

Column 3, line 19,   "5" should be --4--.
Column 5, line 47,   "tone" should be --one--;
          line 65,   "1" should be --31--.
Column 6, line 11,   "19" should be --10--;
          line 66,   "13" should be --12--.
Column 9, line 23,   "the p, adding" should be --1/p, the adding--;
          line 29,   "20" should be --200--.
Column 12, line 19,  after "third" insert --input--.
Column 13, line 59,  after "first" insert --supply--.
Column 14, line 58,  "operating" should be --generating--.
Column 15, line 41,  delete "a".
Column 17, line 7,   after "first" insert --input--;
           line 45,  "suppy" should be --supply--.
Column 18, line 38,  "comprising" should be --producing--.

Signed and Sealed this

Twenty-eighth Day of March, 1989

Attest:

DONALD J. QUIGG

Attesting Officer

Commissioner of Patents and Trademarks